(12) United States Patent
Kim et al.

(10) Patent No.: US 12,525,525 B2
(45) Date of Patent: Jan. 13, 2026

(54) SEMICONDUCTOR PACKAGE INCLUDING REDISTRIBUTION STRUCTURE AND PASSIVATION INSULATING FILM IN CONTACT WITH CONDUCTIVE PAD

(71) Applicant: Samsung Electronics Co., Ltd., Suwon-si (KR)

(72) Inventors: Jiyeong Kim, Suwon-si (KR); Jinyoung Kim, Suwon-si (KR); Jihye Shim, Suwon-si (KR); Okseon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 326 days.

(21) Appl. No.: 18/128,069

(22) Filed: Mar. 29, 2023

(65) Prior Publication Data

US 2023/0411267 A1 Dec. 21, 2023

(30) Foreign Application Priority Data

Jun. 15, 2022 (KR) .................. 10-2022-0073062

(51) Int. Cl.
*H01L 23/498* (2006.01)
*H01L 23/00* (2006.01)
*H01L 25/10* (2006.01)

(52) U.S. Cl.
CPC .. *H01L 23/49838* (2013.01); *H01L 23/49816* (2013.01); *H01L 23/49894* (2013.01);
(Continued)

(58) Field of Classification Search
CPC ......... H01L 23/49838; H01L 23/49816; H01L 23/49894; H01L 24/08; H01L 24/16; H01L 25/105

See application file for complete search history.

(56) References Cited

U.S. PATENT DOCUMENTS

| 6,590,295 B1 | 7/2003 | Liao et al. |
| 9,543,263 B2 | 1/2017 | Shih et al. |
| | (Continued) | |

FOREIGN PATENT DOCUMENTS

| KR | 10-2020-0004199 A | 1/2020 |
| KR | 10-2020-0038060 A | 4/2020 |
| | (Continued) | |

OTHER PUBLICATIONS

Office Action in Taiwanese Appln. No. 112120916, mailed on Feb. 13, 2025, 44 pages.
(Continued)

*Primary Examiner* — Michael Jung
(74) *Attorney, Agent, or Firm* — Fish & Richardson P.C.

(57) ABSTRACT

A semiconductor package includes a redistribution structure including a wiring structure and an insulating structure covering the wiring structure, the redistribution structure having a first surface and a second surface, which are opposite to each other, the insulating structure including a polymer, a semiconductor chip on the first surface, the semiconductor chip being connected to at least one first wiring pattern in the wiring structure, a passivation insulating film covering the second surface, the passivation insulating film including an inner surface contacting the insulating structure and a hole sidewall defining a hole, the passivation insulating film including an inorganic insulating material, a conductive pad passing through the passivation insulating film via the hole and contacting the second wiring pattern, the conductive pad having a pad sidewall contacting the hole sidewall, and an external connection terminal on the conductive pad.

18 Claims, 41 Drawing Sheets

(52) U.S. Cl.
CPC .............. *H01L 24/08* (2013.01); *H01L 24/16* (2013.01); *H01L 25/105* (2013.01); *H01L 2224/08235* (2013.01); *H01L 2224/16235* (2013.01); *H01L 2225/1041* (2013.01); *H01L 2225/1058* (2013.01); *H01L 2924/182* (2013.01)

(56) References Cited

U.S. PATENT DOCUMENTS

| | | | |
|---|---|---|---|
| 9,698,081 | B2 | 7/2017 | Yu et al. |
| 9,922,845 | B1 | 3/2018 | Shih |
| 10,153,240 | B2 | 12/2018 | Lu et al. |
| 10,541,228 | B2 | 1/2020 | Chen et al. |
| 10,665,565 | B2 | 5/2020 | Lin et al. |
| 10,840,199 | B2 | 11/2020 | Chang et al. |
| 10,847,459 | B2 | 11/2020 | Liu et al. |
| 10,861,801 | B2 | 12/2020 | Jeng et al. |
| 10,998,267 | B2 | 5/2021 | Ji et al. |
| 11,195,810 | B2 | 12/2021 | Chen et al. |
| 2020/0013740 | A1* | 1/2020 | Bae .......................... H01L 24/13 |
| 2020/0105676 | A1* | 4/2020 | Jin ........................ H01L 21/568 |
| 2020/0203283 | A1* | 6/2020 | Lee .................... H01L 23/49827 |
| 2021/0351173 | A1 | 11/2021 | Lin et al. |

FOREIGN PATENT DOCUMENTS

| | | |
|---|---|---|
| KR | 10-2021-0120532 A | 10/2021 |
| TW | 201818520 A | 5/2018 |
| TW | 201906092 A | 2/2019 |
| TW | 202109804 A | 3/2021 |

OTHER PUBLICATIONS

Office Action in Korean Appln. No. 10-2022-0073062, mailed on Nov. 27, 2025 21 pages (with English translation).

* cited by examiner

SEMICONDUCTOR PACKAGE INCLUDING REDISTRIBUTION STRUCTURE AND PASSIVATION INSULATING FILM IN CONTACT WITH CONDUCTIVE PAD

CROSS-REFERENCE TO RELATED APPLICATION

This application is based on and claims priority under 35 U.S.C. § 119 to Korean Patent Application No. 10-2022-0073062, filed on Jun. 15, 2022, in the Korean Intellectual Property Office, the disclosure of which is incorporated by reference herein in its entirety.

BACKGROUND

Due to the development of electronics technology, electronic devices are gradually becoming smaller, more multifunctional, and larger in capacity. Accordingly, a semiconductor package including a redistribution structure has been developed to embody a highly integrated semiconductor chip in which the number of connection terminals for data input/output (I/O) is increased. Developing techniques for structures capable of preventing the insulating structure in the redistribution structure from being chemically damaged, physically damaged, or both from the outside and methods of implementing the structures can ensure the reliability of the semiconductor package.

SUMMARY

The subject matter of the present disclosure relates to a semiconductor package, and more particularly to a semiconductor package including a passivation insulating film and a redistribution structure, which has improved reliability by being configured to prevent an insulating structure in the redistribution structure from being chemically damaged, physically damaged, or both from the outside. The passivation insulating film being relatively thin, e.g., thinner than a conductive pad, can, in some implementations, reduce the likelihood of cracks in the passivation insulating film and curving relative to the redistribution structure.

In general, innovative aspects of the subject matter described in this specification can be embodied in a semiconductor package including: a redistribution structure including a wiring structure and an insulating structure covering the wiring structure, the redistribution structure having a first surface and a second surface, which are opposite to each other, the insulating structure including a polymer, a semiconductor chip on the first surface of the redistribution structure, the semiconductor chip being connected to at least one first wiring pattern included in the wiring structure, a passivation insulating film covering the second surface of the redistribution structure, the passivation insulating film including an inner surface in contact with the insulating structure and a hole sidewall defining a hole located at a position corresponding a second wiring pattern included in the wiring structure, the second wiring pattern being adjacent to the second surface of the redistribution structure, the passivation insulating film including an inorganic insulating material, a conductive pad passing through the passivation insulating film via the hole and contacting the second wiring pattern, the conductive pad having a pad sidewall including a portion in contact with the hole sidewall of the passivation insulating film, and an external connection terminal on the conductive pad.

Another general aspect can be embodied in a semiconductor package including: a redistribution structure including a wiring structure and an insulating structure covering the wiring structure, the redistribution structure having a first surface and a second surface, which are opposite to each other, the insulating structure including a polymer, a semiconductor chip on the first surface of the redistribution structure, the semiconductor chip being connected to a plurality of first wiring patterns included in the wiring structure, a passivation insulating film covering the second surface of the redistribution structure, the passivation insulating film including an inner surface in contact with the insulating structure and a plurality of hole sidewalls defining a plurality of holes located at positions corresponding to a plurality of second wiring patterns included in the wiring structure, which are adjacent to the second surface of the redistribution structure, a plurality of conductive pads passing through the passivation insulating film through the plurality of holes, and a plurality of external connection terminals on the plurality of conductive pads, wherein each of the plurality of conductive pads is in contact with a selected one of the plurality of second wiring patterns, and each of the plurality of hole sidewalls of the passivation insulating film is in contact with a pad sidewall of a selected one of the plurality of conductive pads such that there are no spaces between the passivation insulating film and the plurality of conductive pads.

Another general aspect can be embodied in a semiconductor package including a redistribution structure including an insulating structure and a wiring structure, the redistribution structure having a first surface and a second surface, which are opposite to each other, the insulating structure including a photoimagable dielectric (PID) including a polymer, the wiring structure including a plurality of wiring patterns located in the insulating structure, a package unit on the first surface of the redistribution structure, the package unit including a semiconductor chip and a plurality of conductive posts adjacent to the semiconductor chip, the semiconductor chip being connected to a plurality of first wiring patterns selected from the plurality of wiring patterns, the plurality of conductive posts being connected to a plurality of second wiring patterns selected from the plurality of wiring patterns, a passivation insulating film in contact with the second surface of the redistribution structure, the passivation insulating film including an inorganic insulating material having a dielectric constant of about 7.5 or lower, a plurality of conductive pads passing through the passivation insulating film to contact a plurality of third wiring patterns being selected from the plurality of wiring patterns, a plurality of solder balls on the plurality of conductive pads, wherein the passivation insulating film includes a plurality of holes and a plurality of hole sidewalls, the plurality of holes being configured to allow the plurality of conductive pads to pass therethrough, the plurality of hole sidewalls contacting respective pad sidewalls of the plurality of conductive pads such that there are no spaces between the plurality of conductive pads and the passivation insulating film, and the plurality of conductive pads include a plurality of first conductive pads and a plurality of second conductive pads, wherein the plurality of first conductive pads are connected to the semiconductor chip through the wiring structure, and the plurality of second conductive pads are connected to the plurality of conductive posts through the wiring structure.

BRIEF DESCRIPTION OF THE DRAWINGS

Implementations of the subject matter of the present disclosure will be more clearly understood from the follow-

Figure 1A:
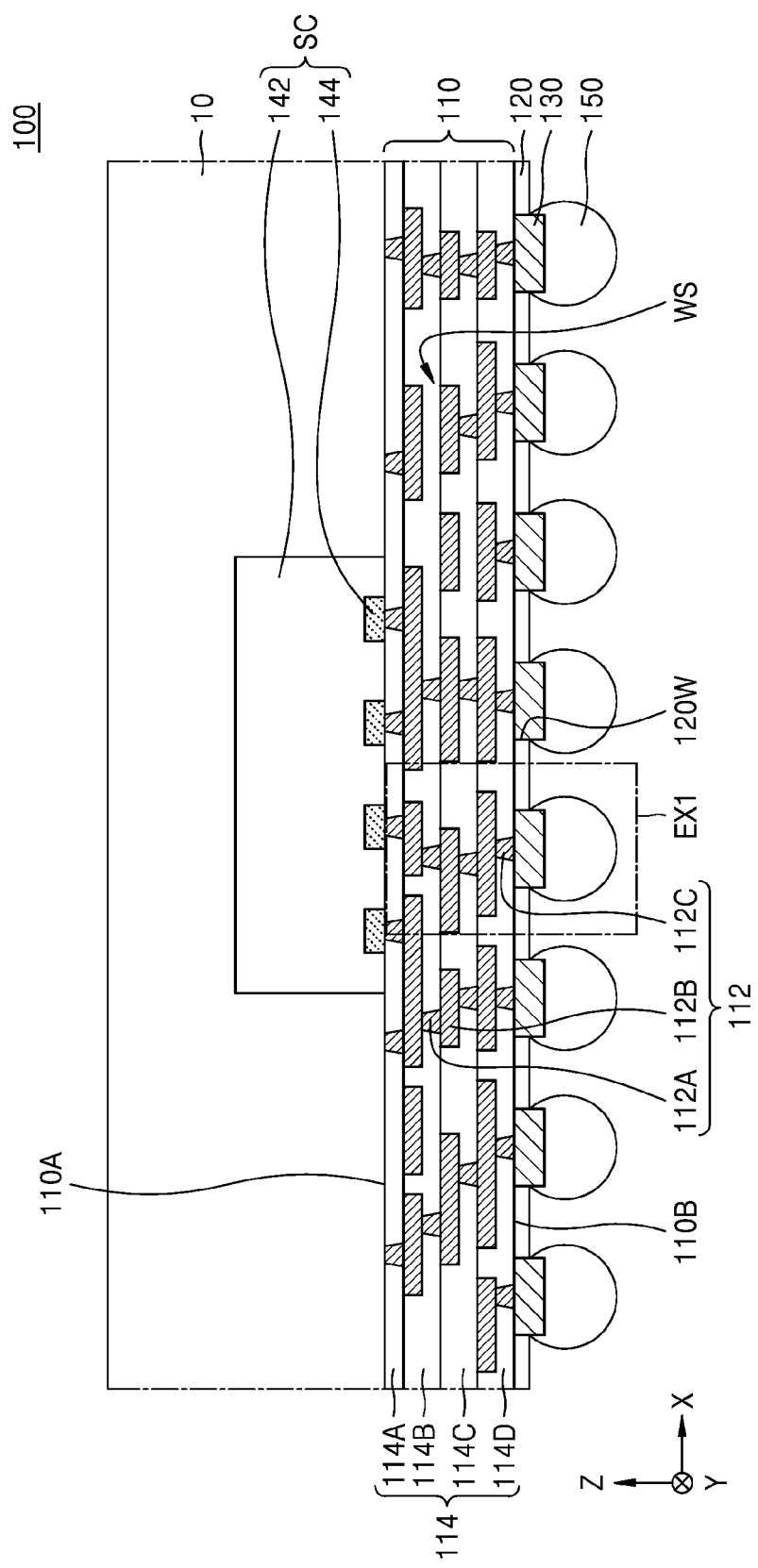
Figure 1B:
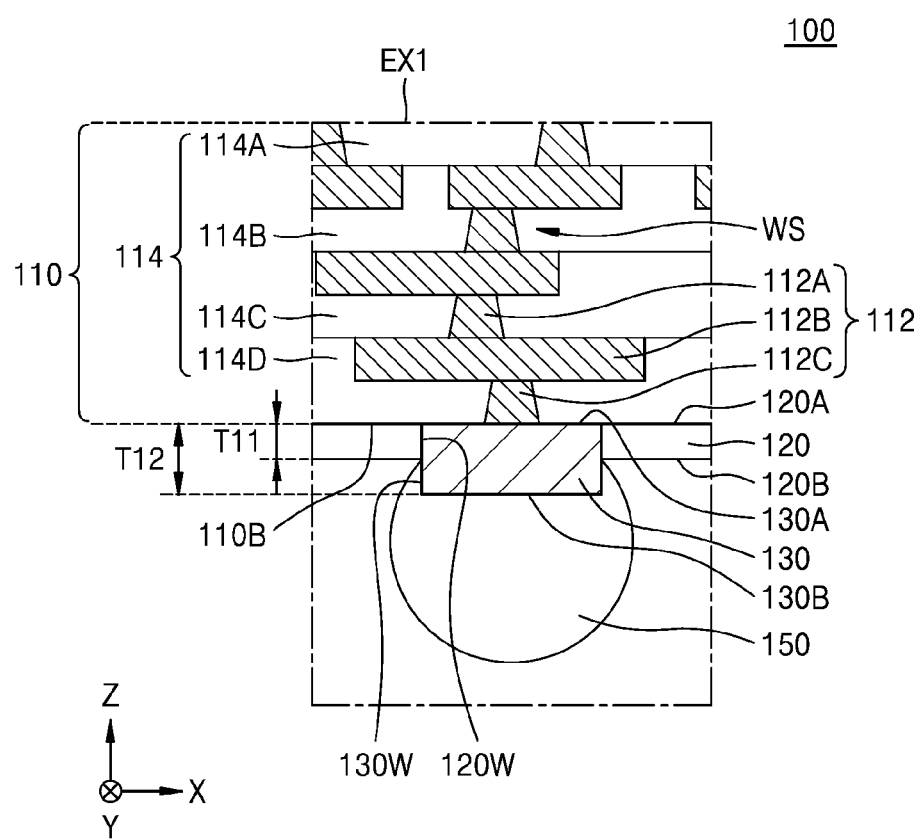
Figure 2:
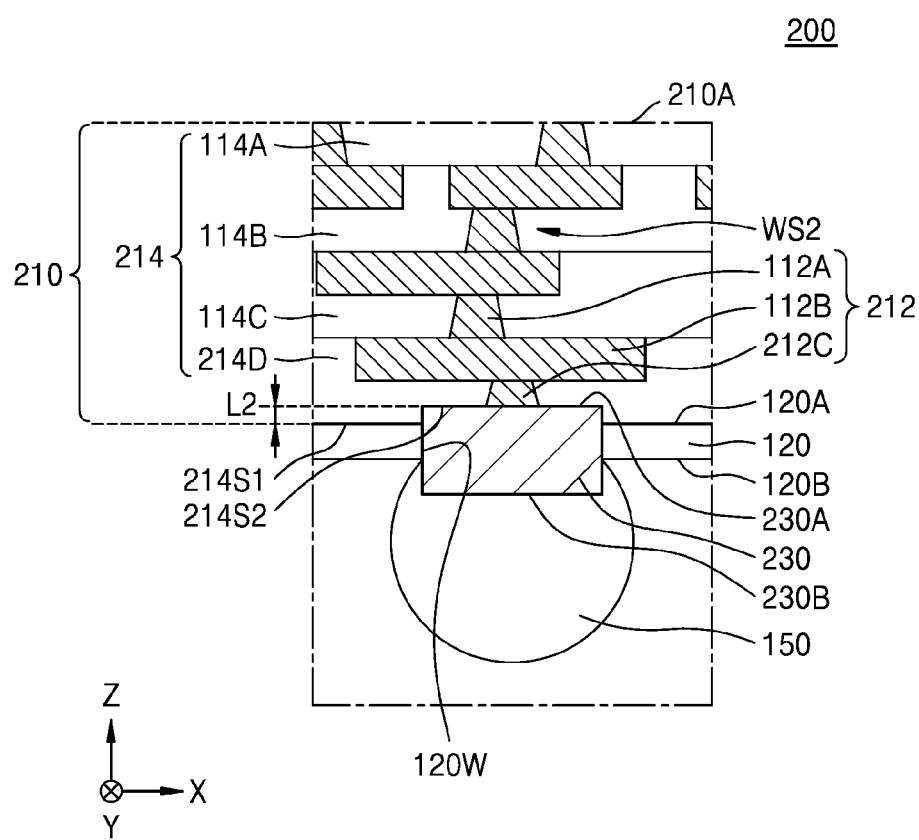
Figure 3:
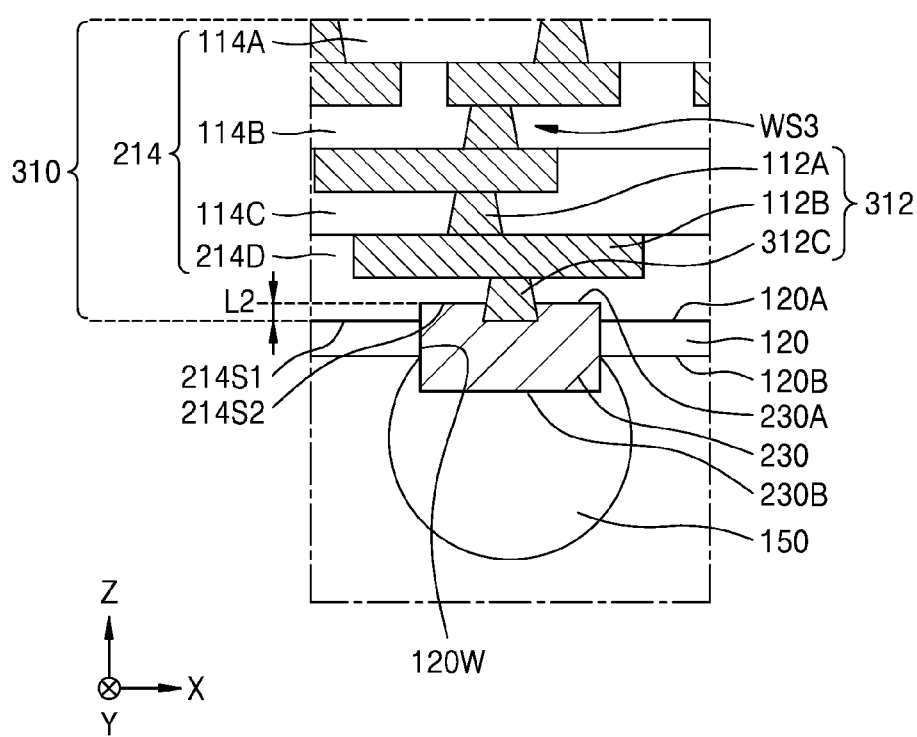
Figure 4:
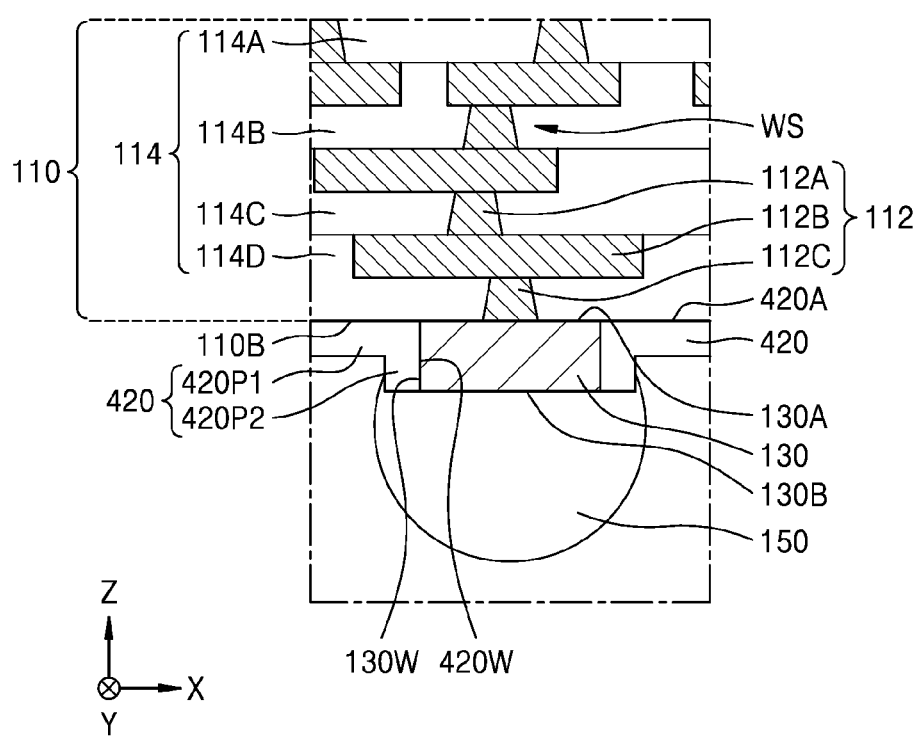
Figure 5:
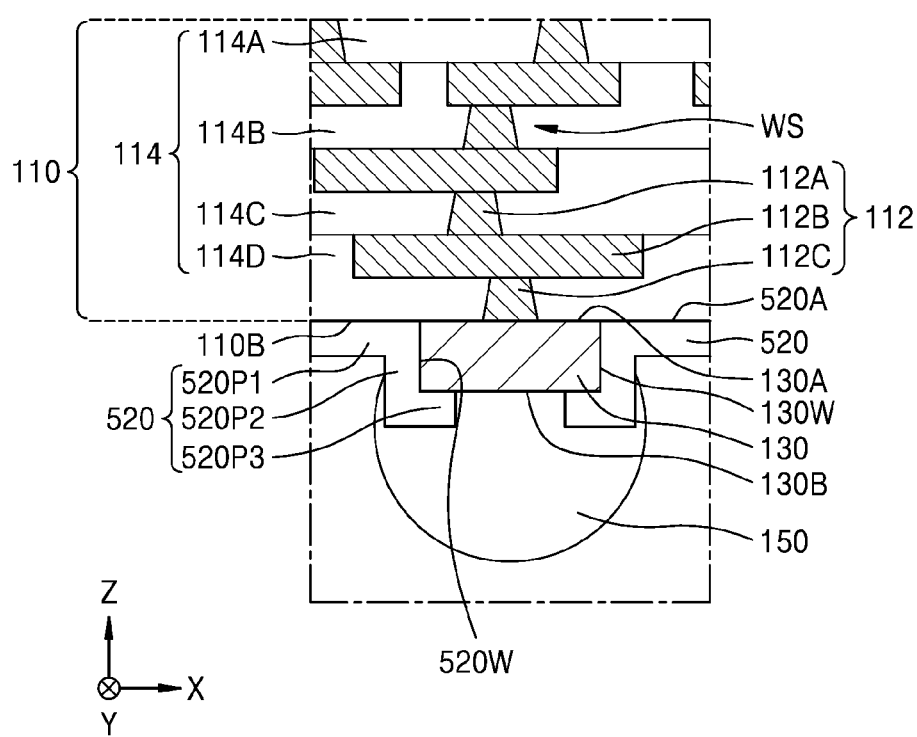
Figure 6:
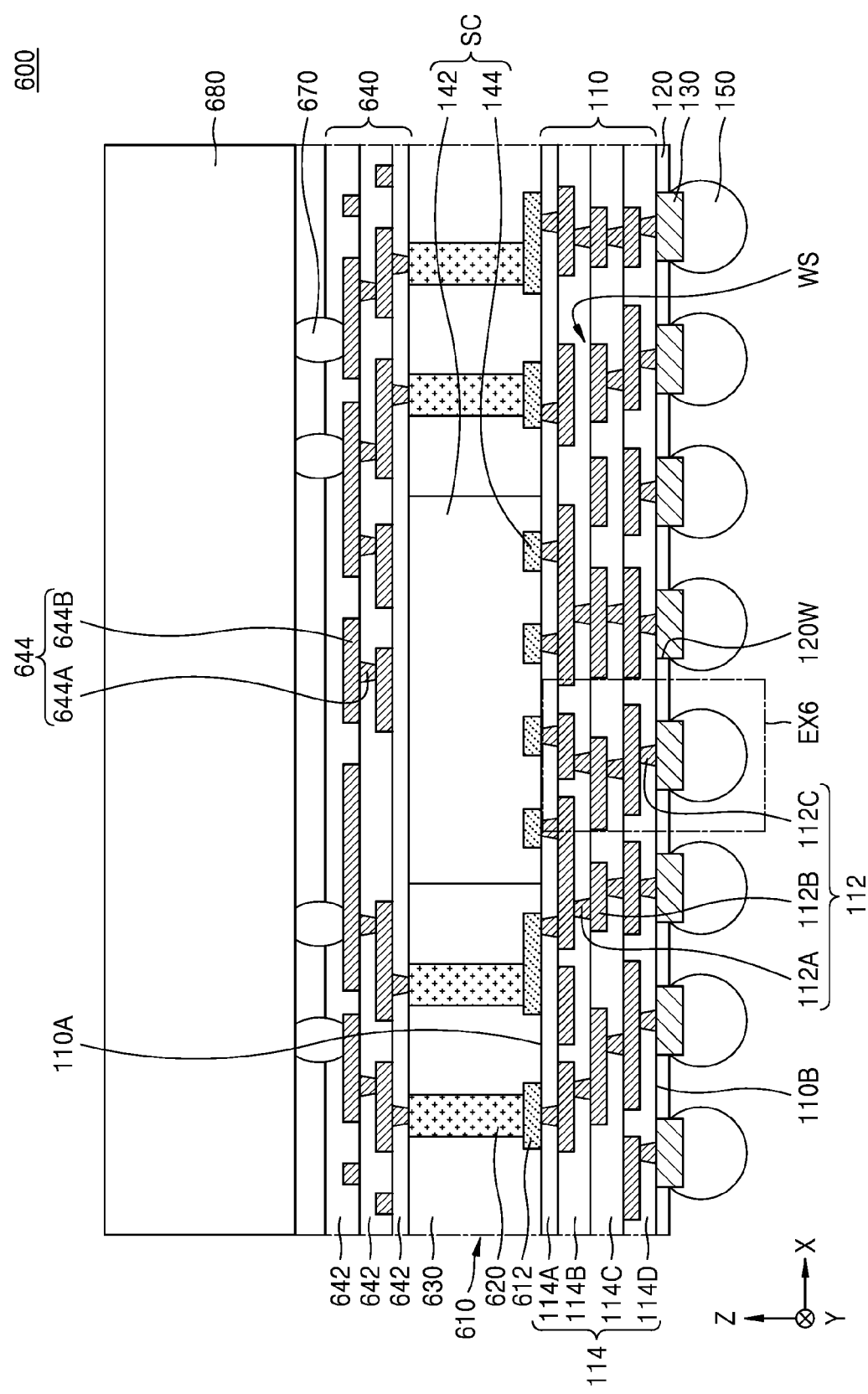
Figure 7:
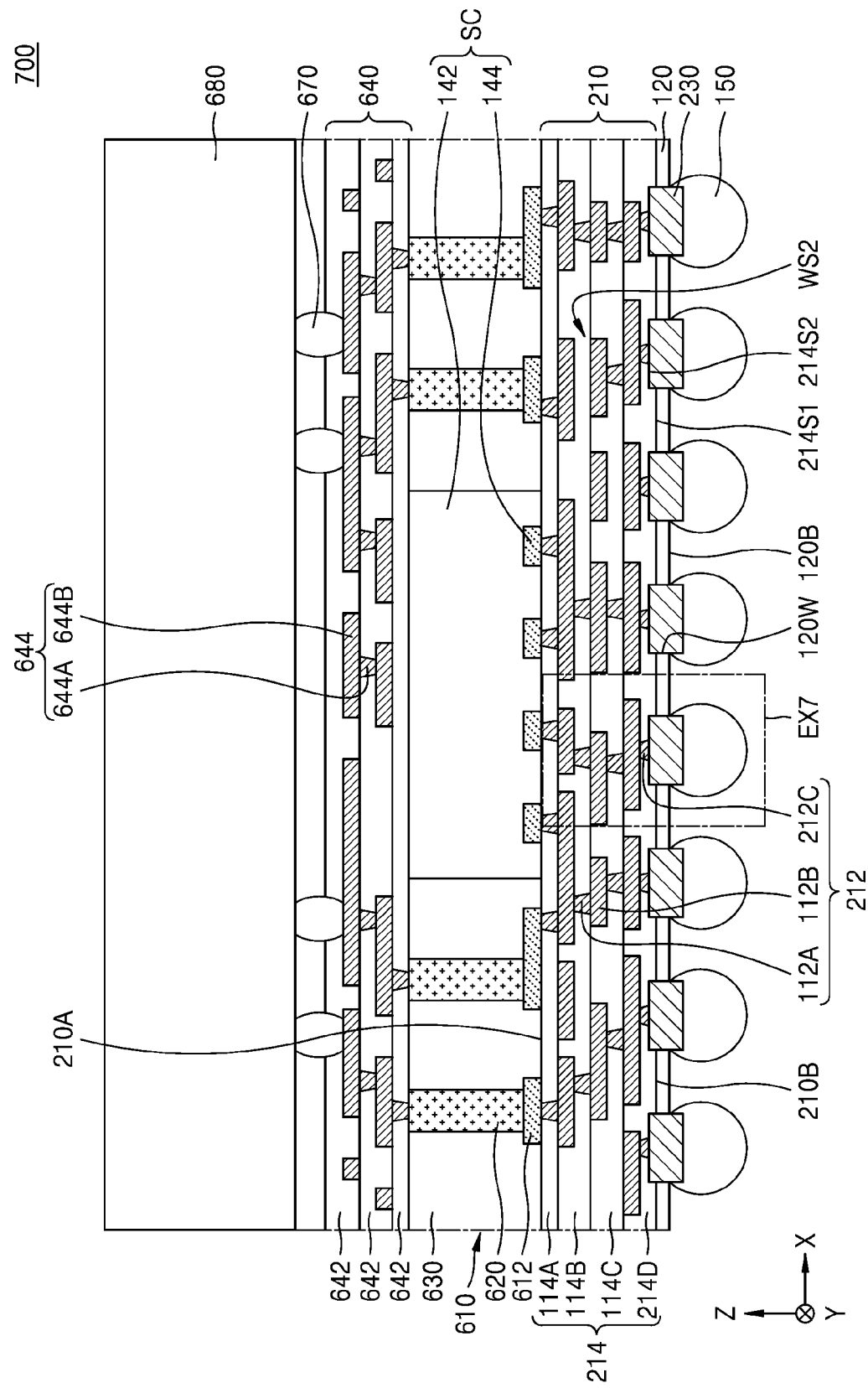
Figure 8:
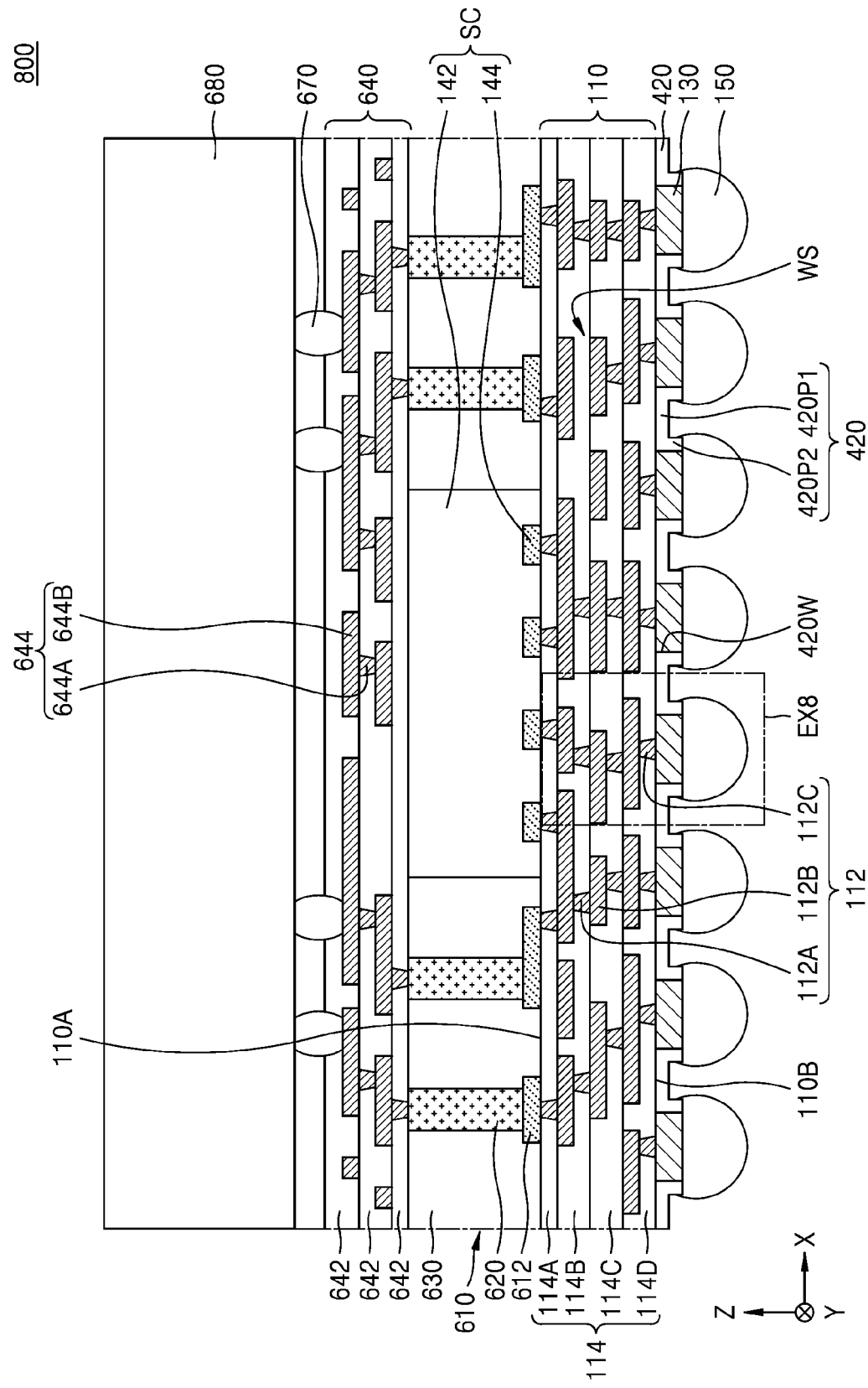
Figure 9:
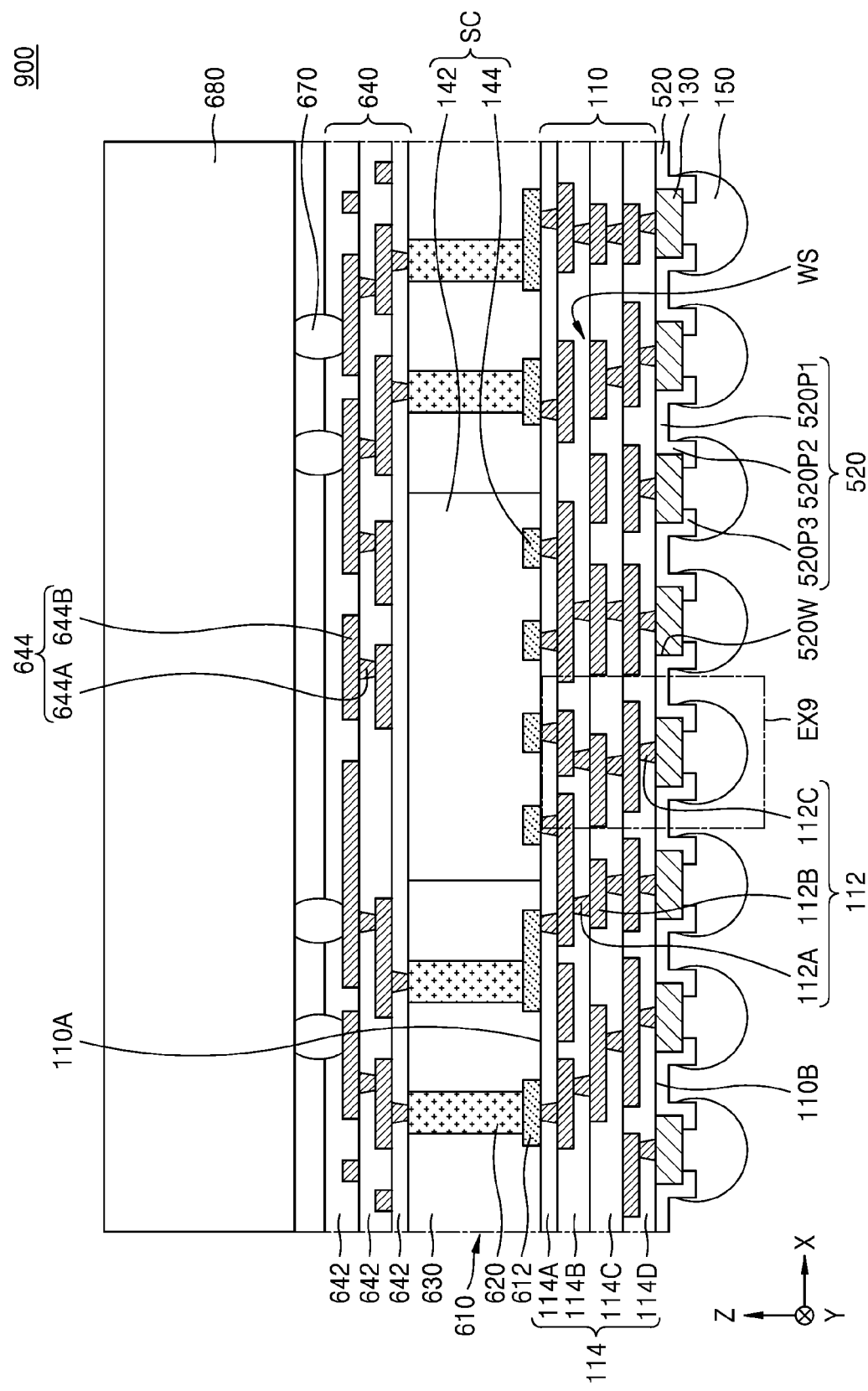
Figure 10:
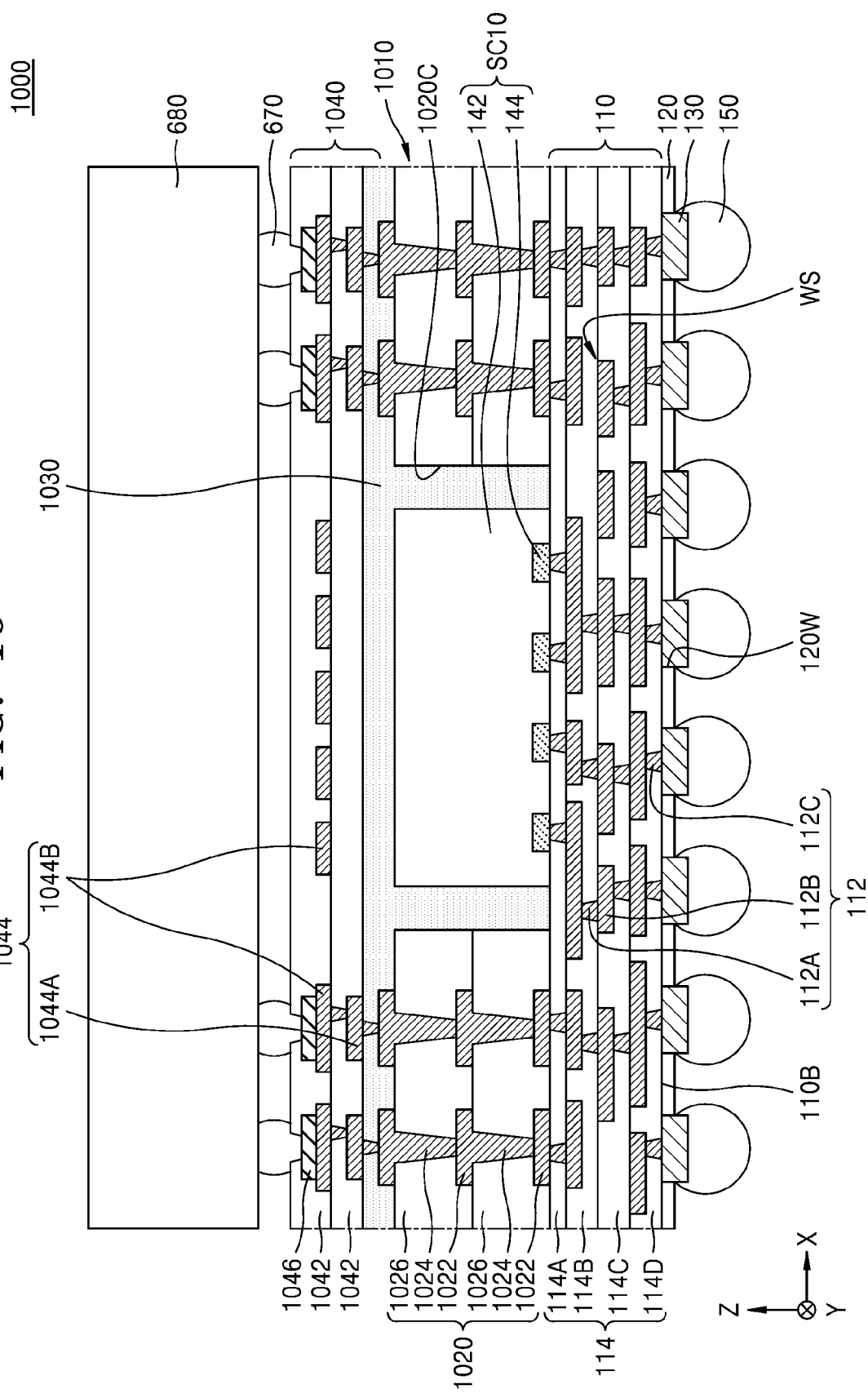
Figure 14A:
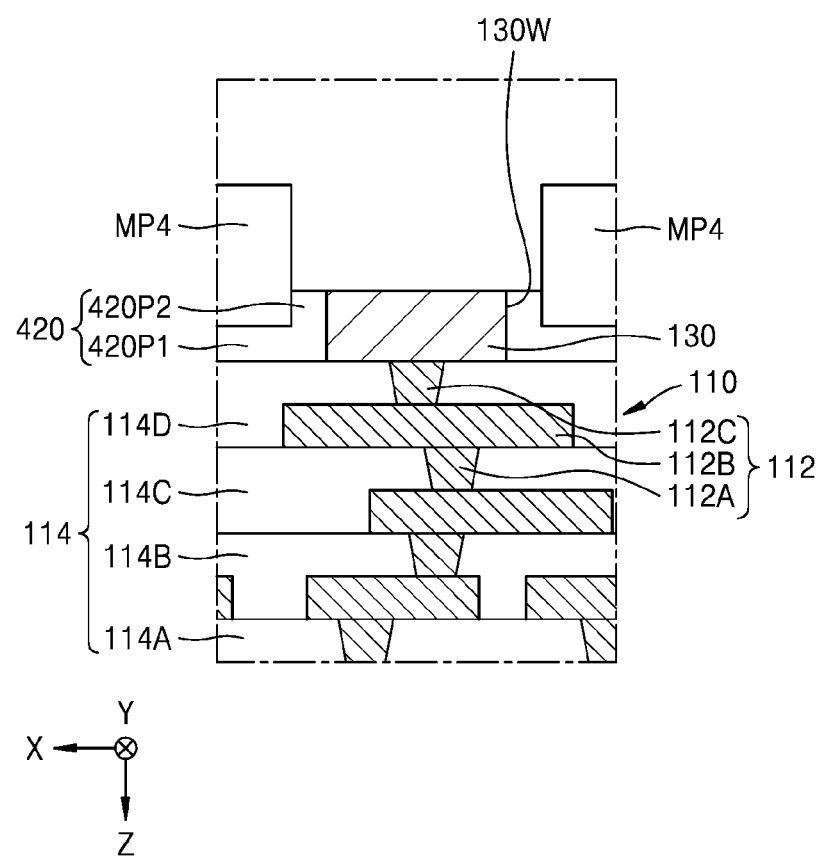
Figure 14B:
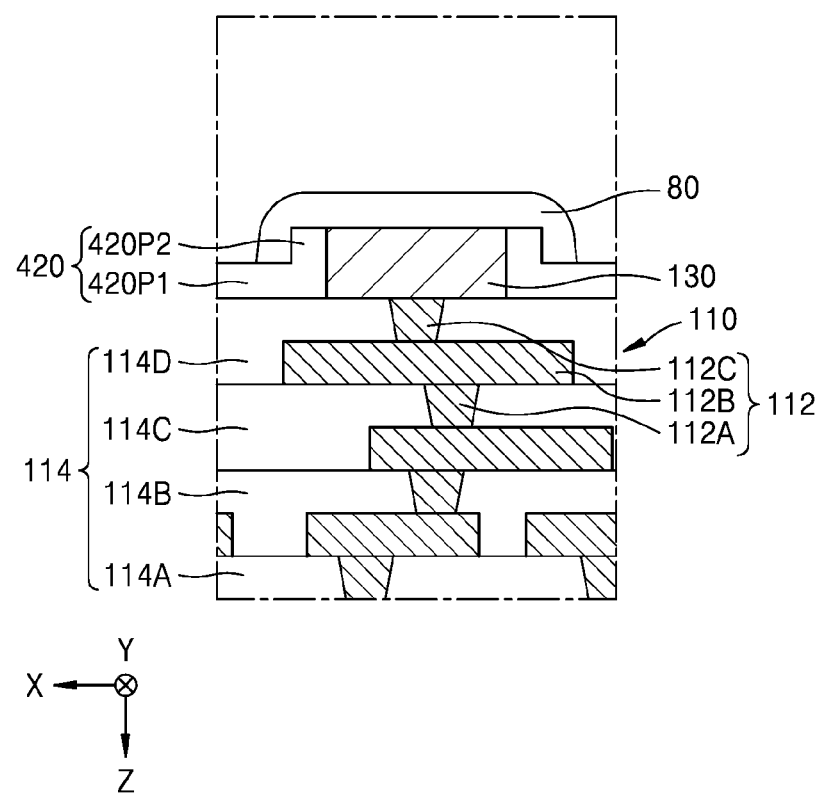
Figure 14C:
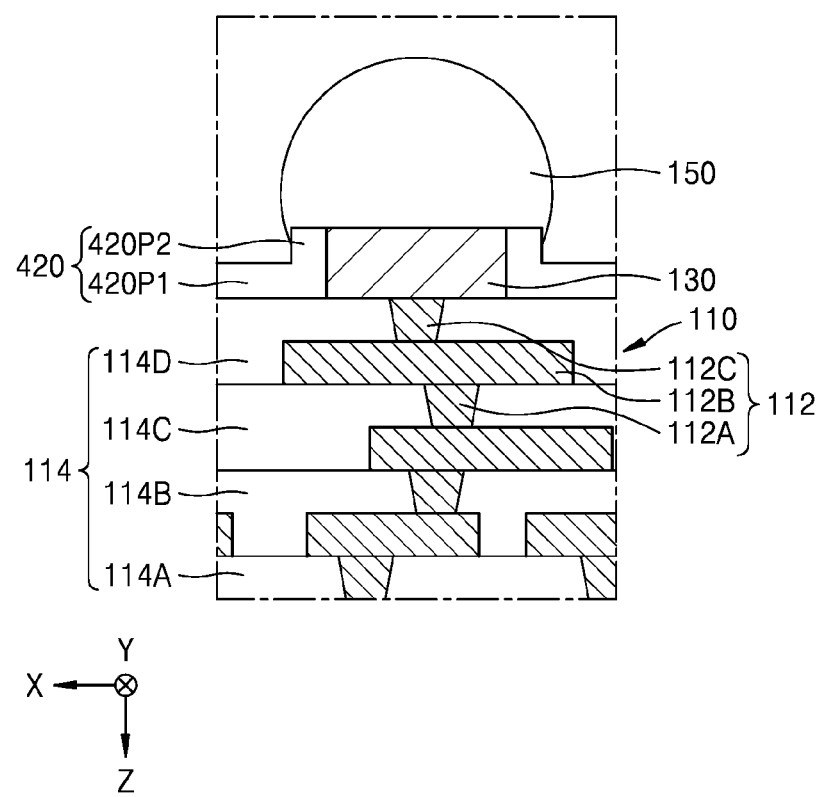

3 ing detailed description taken in conjunction with the accompanying drawings in which:

FIG. 1A is a cross-sectional view of an example of a semiconductor package; FIG. 1B is an enlarged cross-sectional view of portion "EX1" of FIG. 1A;

FIG. 2 is a cross-sectional view of an example of a semiconductor package;

FIG. 3 is a cross-sectional view of an example of a semiconductor package;

FIG. 4 is a cross-sectional view of an example of a semiconductor package;

FIG. 5 is a cross-sectional view of an example of a semiconductor package;

FIG. 6 is a cross-sectional view of an example of a semiconductor package;

FIG. 7 is a cross-sectional view of an example of a semiconductor package;

FIG. 8 is a cross-sectional view of an example of a semiconductor package;

FIG. 9 is a cross-sectional view of an example of a semiconductor package;

FIG. 10 is a cross-sectional view of an example of a semiconductor package;

FIGS. 11A to 11M are cross-sectional views illustrating, according to a process sequence, a method of manufacturing an example of a semiconductor package;

FIGS. 12A to 12D are cross-sectional views illustrating, according to a process sequence, a method of manufacturing an example of a semiconductor package;

FIGS. 13A to 13F are cross-sectional views illustrating, according to a process sequence, a method of manufacturing an example of a semiconductor package;

FIGS. 14A to 14C are cross-sectional views illustrating, according to a process sequence, a method of manufacturing an example of a semiconductor package; and FIGS. 15A to 15D are cross-sectional views illustrating, according to a process sequence, a method of manufacturing an example of a semiconductor package.

DETAILED DESCRIPTION

Hereinafter, implementations will be described in detail with reference to the accompanying drawings. The same reference numerals are used to denote the same elements in the drawings, and repeated descriptions thereof are omitted.

FIG. 1A is a cross-sectional view of an example of a semiconductor package 100. FIG. 1B is an enlarged cross-sectional view of portion "EX1" of FIG. 1A.

Referring to FIGS. 1A and 1B, the semiconductor package 100 may include a redistribution structure 110, a package unit 10, a passivation insulating film 120, and a plurality of conductive pads 130. The redistribution structure 110 may have a first surface 110A and a second surface 110B, which are opposite to each other. The package unit 10 may include a semiconductor chip SC on the first surface 110A of the redistribution structure 110. The passivation insulating film 120 may cover the second surface 110B of the redistribution structure 110. The plurality of conductive pads 130 may pass through the passivation insulating film 120.

The redistribution structure 110 may include a wiring structure WS and an insulating structure 114 that covers the wiring structure WS and includes a polymer. The wiring structure WS may include a plurality of wiring patterns 112. The plurality of wiring patterns 112 may include a plurality of conductive via patterns 112A, a plurality of conductive line patterns 112B, and a plurality of outermost wiring patterns 112C. An inner surface 130A of each of the plurality of conductive pads 130 may be in contact with a selected one of the plurality of outermost wiring patterns 112C. As used herein, each of the plurality of conductive via patterns 112A, the plurality of conductive line patterns 112B, and the outermost wiring pattern 112C may be referred to as the wiring pattern 112. Some of the plurality of conductive via patterns 112A, the plurality of conductive line patterns 112B, and the plurality of outermost wiring patterns 112C may be connected to each other in a vertical direction (Z direction). Some other ones of the plurality of conductive via patterns 112A, the plurality of conductive line patterns 112B, and the plurality of outermost wiring patterns 112C may be electrically insulated from each other by the insulating structure 114.

In some implementations, the wiring structure WS in the redistribution structure 110 may include copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof.

The insulating structure 114 may include first to fourth insulating layers 114A, 114B, 114C, and 114D, which are sequentially stacked on the first surface 110A of the redistribution structure 110. However, configurations of the wiring structure WS and the insulating structure 114 in the redistribution structure 110 are not limited to the examples in FIG. 1A and may be variously modified and changed.

The insulating structure 114 may include a photoimagable dielectric (PID). In some implementations, the insulating structure 114 in the redistribution structure 110 may include at least one kind of polymer. For example, the insulating structure 114 may include photosensitive polyimide, polybenzoxazole, polyphenol, a benzocyclobutene-based polymer, or a combination thereof. The insulating structure 114 may further include a photoactive compound. The photoactive compound may include diazonaphtoquinone (DNQ), without being limited thereto.

The semiconductor chip SC may include a semiconductor device 142 and plurality of chip pads 144 in one surface of the semiconductor device 142. The semiconductor chip SC may be adhered onto the redistribution structure 110 such that the plurality of chip pads 144 face the redistribution structure 110. The plurality of chip pads 144 in the semiconductor chip SC may be connected to at least one wiring pattern 112 selected from the wiring structure WS in the redistribution structure 110.

The passivation insulating film 120 may cover the second surface 110B of the redistribution structure 110. The passivation insulating film 120 may be in contact with a surface of the insulating structure 114, which forms the second surface 110B of the redistribution structure 110. A portion of the passivation insulating film 120, which is in contact with the second surface 110B of the redistribution structure 110, may not include a portion that is bent in the vertical direction (Z direction). The passivation insulating film 120 may include an inner surface 120A in contact with the insulating structure 114, an outer surface 120B that is opposite to the inner surface 120A, and a plurality of hole sidewalls 120W defining a plurality of holes (e.g., a plurality of holes 120H shown in FIG. 11J). Each of the plurality of holes may be at a position corresponding to the outermost wiring pattern 112C of the wiring structure WS, which is adjacent to the second surface 110B of the redistribution structure 110.

The passivation insulating film 120 may include an inorganic insulating material having a dielectric constant of about 7.5 or less. In some implementations, the passivation insulating film 120 may include a silicon oxide film, a silicon nitride film, or a combination thereof. The silicon oxide film may include a $SiO_2$ film. The silicon nitride film may include a $Si_3N_4$ film.

Each of the plurality of conductive pads 130 may pass through the passivation insulating film 120 via a hole, which is defined by a selected one of the plurality of hole sidewalls 120W, and be connected to the outermost wiring pattern 112 of the wiring structure WS, which is adjacent to the second surface 110B of the redistribution structure 110. Each of the plurality of conductive pads 130 may include an inner surface 130A, an outer surface 130B, and a pad sidewall 130W. The inner surface 130A may be in contact with the outer wiring pattern 112 of the wiring structure WS, which is adjacent to the second surface 110B of the redistribution structure 110. The outer surface 130B may be a surface opposite to the inner surface 130A. The pad sidewall 130W may face the hole sidewall 120W of the passivation insulating film 120. The pad sidewall 130W of each of the plurality of conductive pads 130 may include a portion in contact with the hole sidewall 120W of the passivation insulating film 120. There may be no space between the passivation insulating film 120 and each of the plurality of conductive pads 130. Accordingly, the insulating structure 114 may not include a portion that is exposed through the space between the passivation insulating film 120 and each of the plurality of conductive pads 130. A portion of the pad sidewall 130W of each of the plurality of conductive pads 130, which is adjacent to the outer surface 130B, may not be in contact with the hole sidewall 120W of the passivation insulating film 120.

In the semiconductor package 100 shown in FIGS. 1A and 1B, in a direction (or Z direction in FIGS. 1A and 1B) that is perpendicular to the first surface 110A of the redistribution structure 110, a portion of the passivation insulating film 120, which covers the insulating structure 114 at a position apart from the conductive pad 130, may have a thickness T11 that is less than a thickness T12 of the conductive pad 130. Each of the plurality of conductive pads 130 may protrude more than the outer surface 120B of the passivation insulating film 120 in a direction away from the second surface 110B of the redistribution structure 110. For example, a portion of each of the plurality of conductive pads 130 may protrude over the outer surface 120B of the passivation insulating film 120 in a direction away from the passivation insulating film 120. The inner surface 130A of each of the plurality of conductive pads 130 may extend on the same plane as the inner surface 120A of the passivation insulating film 120. The passivation insulating film 120 may have a thickness selected in a range of about 50 nm to about 500 nm, and each of the plurality of conductive pads 130 may have a thickness selected in a range of about 0.15 μm to about 3.0 μm, without being limited thereto.

The passivation insulating film 120 may not include a portion overlapping the conductive pad 130 in a direction (or Z direction in FIGS. 1A and 1B) that is perpendicular to the first surface 110A of the redistribution structure 110.

Each of the plurality of conductive pads 130 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof, without being limited thereto. In some implementations, each of the plurality of conductive pads 130 may include a single metal material. In some implementations, each of the plurality of conductive pads 130 may have a multilayered structure in which respective layers include different metal materials from each other.

On the second surface 110B of the redistribution structure 110, a plurality of external connection terminals 150 may respectively be on the plurality of conductive pads 130. Each of the plurality of external connection terminals 150 may be in contact with the outer surface 130B of a selected one of the plurality of conductive pads 130. In some implementations, each the plurality of external connection terminals 150 may include tin (Sn), silver (Ag), copper (Cu), nickel (Ni), or a combination thereof, without being limited thereto. In some implementations, each of the plurality of external connection terminals 150 may include a solder ball, without being limited thereto.

The semiconductor chip SC in the package unit 10 shown in FIG. 1A may include a semiconductor substrate. The semiconductor substrate may include an element semiconductor (e.g., silicon (Si) and germanium (Ge)) or a compound semiconductor (e.g., silicon carbide (SiC), gallium arsenide (GaAs), indium arsenide (InAs), and indium phosphide (InP)). The semiconductor chip SC may have an active surface and an inactive surface opposite to the active surface. In some implementations, the active surface of the semiconductor chip SC may face the redistribution structure 110. The semiconductor chip SC may include a plurality of individual devices of various types.

Through the chip pad 144, the redistribution structure 110, and the conductive pad 130, the semiconductor chip SC may receive at least one of a control signal for an operation of the semiconductor chip SC, a power signal, and a ground signal from the outside, receive a data signal to be stored in the semiconductor chip SC from the outside, or provide data stored in the semiconductor chip SC to the outside.

In some implementations, the semiconductor chip SC may include a logic chip or a memory chip. The logic chip may include a microprocessor. For example, the logic chip may include a central processing unit (CPU), a controller, an application specific integrated circuit (ASIC), or a combination thereof. The memory chip may be a volatile memory chip (e.g., dynamic random access memory (DRAM) and static RAM (SRAM)) or a non-volatile memory chip (e.g., phase-change RAM (PRAM), magnetoresistive RAM (MRAM), ferroelectric RAM (FeRAM), and resistive RAM (RRAM)). In some implementations, the memory chip may be a high-bandwidth memory (HBM) DRAM semiconductor chip.

In some implementations, the semiconductor chip SC may be an application processor (AP) chip of a System on Chip (SoC) type, which is used in a mobile system (e.g., a mobile phone, an MPEG-1 audio layer 3 (MP3) player, a navigation, and a portable media player (PMP)), or a double data rate (DDR) synchronous dynamic RAM (SDRAM) chip (hereinafter, "DDR chip") used in the mobile system.

In the semiconductor package 100 described with reference to FIGS. 1A and 1B, because the insulating structure 114 in the redistribution structure 110 is covered by the passivation insulating film 120, when the external connection terminal 150, which is electrically connectable to the wiring structure WS in the redistribution structure 110, is formed during the manufacture of the semiconductor package 100, a chemical material (e.g., an organic solvent in flux) may be prevented from penetrating the insulating structure 114 in the redistribution structure 110 by the passivation insulating film 120. Accordingly, because the insulating structure 114 does not come into contact with the flux, the insulating structure 114 may be prevented from being chemically damaged by a chemical material derived from flux or physically damaged due to a lifting phenomenon, a peeling phenomenon, or both. Accordingly, the reliability of the semiconductor package 100 may be improved.

FIG. 2 is a cross-sectional view of an example of a semiconductor package 200. FIG. 2 illustrates an enlarged cross-sectional configuration of a portion corresponding to portion "EX1" of FIG. 1A. In FIG. 2, the same reference numerals are used to denote the same elements as in FIGS. 1A and 1B, and detailed descriptions thereof are omitted.

Referring to FIG. 2, the semiconductor package 200 may substantially have the same configuration as that of the semiconductor package 100 described with reference to FIGS. 1A and 1B. However, in the semiconductor package 200, a redistribution structure 210 may include a wiring structure WS2 and an insulating structure 214, which covers the wiring structure WS2 and includes a polymer. In addition, the semiconductor package 200 may include a plurality of conductive pads 230 instead of the plurality of conductive pads 130 described with reference to FIGS. 1A and 1B. A conductive pad 230 may pass through a passivation insulating film 120 and be electrically connected to a wiring pattern 212 in the wiring structure WS2. The conductive pad 230 may protrude over an inner surface 120A of the passivation insulating film 120 in a direction away from the passivation insulating film 120 and protrude over an outer surface 120B of the passivation insulating film 120 in the direction away from the passivation insulating film 120.

In a direction that is perpendicular to the inner surface 120A of the passivation insulating film 120, e.g., the Z direction, an inner surface 230A of the conductive pad 230 may be closer to a package unit 10 including a semiconductor chip SC than the inner surface 120A of the passivation insulating film 120. In the direction that is perpendicular to the inner surface 120A of the passivation insulating film 120, e.g., the Z direction, an outer surface 230B of the conductive pad 230 may be farther from the package unit 10 including the semiconductor chip SC than the outer surface 120B of the passivation insulating film 120.

The plurality of wiring patterns 212 in the wiring structure WS2 may include an outermost wiring pattern 212C in contact with the inner surface 230A of the conductive pad 230. The insulating structure 214 may include first to fourth insulating layers 114A, 114B, 114C, and 214D, which are sequentially stacked on a first surface 210A of the redistribution structure 210. The fourth insulating layer 214D may include a first surface 214S1 in contact with the passivation insulating film 120 and a second surface 214S2, which is recessed from the first surface 214S1 toward the first surface 210A of the redistribution structure 210. The second surface 214S2 of the fourth insulating layer 214D may be in contact with the inner surface 230A of the conductive pad 230.

In some implementations, a surface of the outermost wiring pattern 212C, which is in contact with the inner surface 230A of the conductive pad 230, and the second surface 214S2 of the insulating structure 214 may extend on the same plane.

In the direction that is perpendicular to the inner surface 120A of the passivation insulating film 120, e.g., the Z direction, the second surface 214S2 of the insulating structure 214 may be closer to the first surface (see first surface 110A in FIG. 1A) of the redistribution structure 210 by a first length L2 than the first surface 214S1 of the insulating structure 214.

Details of the redistribution structure 210, the wiring pattern 212, the insulating structure 214, and the conductive pad 230 may be the same as those of the redistribution structure 110, the wiring pattern 112, the insulating structure 114, and the conductive pad 130, which have been described with reference to FIGS. 1A and 1B.

FIG. 3 is a cross-sectional view of an example of a semiconductor package 300. FIG. 3 illustrates an enlarged cross-sectional configuration of a portion corresponding to portion "EX1" of FIG. 1A. In FIG. 3, the same reference numerals are used to denote the same elements as in FIGS. 1A, 1B, and 2, and detailed descriptions thereof are omitted.

Referring to FIG. 3, the semiconductor package 300 may substantially have the same configuration as that of the semiconductor package 200 described with reference to FIG. 2. However, in the semiconductor package 300, a redistribution structure 310 may include a wiring structure WS3 and an insulating structure 214, which covers the wiring structure WS3 and includes a polymer. A plurality of wiring patterns 312 in the wiring structure WS3 may include an outermost wiring pattern 312C in contact with an inner surface 230A of a conductive pad 230. A portion of the outermost wiring pattern 312C may be filled into the conductive pad 230 from the inner surface 230A of the conductive pad 230.

The insulating structure 214 may have a first surface 214S1 in contact with the passivation insulating film 120 and a second surface 214S2 in contact with the inner surface 230A of the conductive pad 230. The outermost wiring pattern 312C may protrude over the second surface 214S2 of the insulating structure 214, which is in contact with the inner surface 230A of the conductive pad 230, toward the outside of the redistribution structure 310 into the conductive pad 230.

In a direction that is perpendicular to the inner surface 120A of the passivation insulating film 120, e.g., the Z direction, the second surface 214S2 of the insulating structure 214 may be closer to a surface (or a surface corresponding to the first surface 110A in FIG. 1A) of the redistribution structure 210, which faces the semiconductor chip SC, by a first length L2 than the first surface 214S1 of the insulating structure 214.

Details of the redistribution structure 310 and the wiring pattern 312 may be the same as those of the redistribution structure 110 and the wiring pattern 112, which have been described with reference to FIGS. 1A and 1B.

FIG. 4 is a cross-sectional view of an example of a semiconductor package 400. FIG. 4 illustrates an enlarged cross-sectional configuration of a portion corresponding to portion "EX1" of FIG. 1A. In FIG. 4, the same reference numerals are used to denote the same elements as in FIGS. 1A and 1B, and detailed descriptions thereof are omitted.

Referring to FIG. 4, the semiconductor package 400 may substantially have the same configuration as that of the semiconductor package 100 described with reference to FIGS. 1A and 1B. However, the semiconductor package 400 may include a passivation insulating film 420 covering a second surface 110B of a redistribution structure 110. A conductive pad 130 may pass through the passivation insulating film 420 and be electrically connected to a wiring pattern 112 in a wiring structure WS.

An inner surface 420A of the passivation insulating film 420 may be in contact with a surface of the fourth insulating layer 114D, which forms the second surface 110B of the redistribution structure 110. The passivation insulating film 420 may include a first passivation portion 420P1 and a second passivation portion 420P2. The first passivation portion 420P1 may be apart from the conductive pad 130. The second passivation portion 420P2 may be bent from the first passivation portion 420P1 and extend in a direction away from the second surface 110B of the redistribution structure 110 along the pad sidewall 130W of the conductive pad 130. A hole sidewall 420W of the passivation insulating film 420 may protrude more than the first passivation portion 420P1 of the passivation insulating film 420, which is apart from the conductive pad 130, in a direction away from the second surface 110B of the redistribution structure 110. Details of the passivation insulating film 420 may be the same as those of the passivation insulating film 120, which has been described with reference to FIGS. 1A and 1B.

FIG. 5 is a cross-sectional view of an example of a semiconductor package 500. FIG. 5 illustrates an enlarged cross-sectional configuration of a portion corresponding to portion "EX1" of FIG. 1A. In FIG. 5, the same reference numerals are used to denote the same elements as in FIGS. 1A and 1B, and detailed descriptions thereof are omitted.

Referring to FIG. 5, the semiconductor package 500 may substantially have the same configuration as that of the semiconductor package 100 described with reference to FIGS. 1A and 1B. However, the semiconductor package 500 may include a passivation insulating film 520 covering a second surface 110B of a redistribution structure 110. A conductive pad 130 may pass through the passivation insulating film 520 and be electrically connected to a wiring pattern 112 in a wiring structure WS.

An inner surface 520A of the passivation insulating film 520 may be in contact with a surface of the fourth insulating layer 114D, which forms the second surface 110B of the redistribution structure 110. The passivation insulating film 520 may include a first passivation portion 520P1, a second passivation portion 520P2, and a third passivation portion 520P3. The first passivation portion 520P may be apart from the conductive pad 130. The second passivation portion 520P2 may be bent from the first passivation portion 520P1 and extend in a direction away from the second surface 110B of the redistribution structure 110 along the pad sidewall 130W of the conductive pad 130. The third passivation portion 520P3 may be bent from the second passivation portion 520P2 and extend along the outer surface 130B of the conductive pad 130 between the conductive pad 130 and the external connection terminal 150. A hole sidewall 520W of the passivation insulating film 520 may protrude more than the first passivation portion 520P1 of the passivation insulating film 520, which is apart from the conductive pad 130, in a direction away from the second surface 110B of the redistribution structure 110. Details of the passivation insulating film 520 may be the same as those of the passivation insulating film 120, which have been described with reference to FIGS. 1A and 1B.

In the semiconductor packages 200, 300, 400, and 500 described with reference to FIGS. 2 to 5, like the semiconductor package 100 described with reference to FIGS. 1A and 1B, because the insulating structures 114 and 214 in the redistribution structures 110 and 210 are covered by the passivation insulating films 120, 420, and 520, when the external connection terminals 150, which are electrically connectable to the wiring structures WS and WS2 in the redistribution structures 110 and 210, are formed during the manufacture of the semiconductor packages 200, 300, 400, and 500, a chemical material (e.g., an organic solvent in flux) may be prevented from penetrating the insulating structures 114 and 214 in the redistribution structures 110 and 210 by the passivation insulating films 120, 420, and 520. Accordingly, because the insulating structures 114 and 214 do not come into contact with the flux, the insulating structures 114 and 214 may be prevented from being chemically damaged by a chemical material derived from flux or physically damaged due to a lifting phenomenon, a peeling phenomenon, or both. Therefore, the reliability of the semiconductor packages 200, 300, 400, and 500 may be improved.

FIG. 6 is a cross-sectional view of an example of a semiconductor package 600. In FIG. 6, the same reference numerals are used to denote the same elements as in FIGS. 1A and 1B, and detailed descriptions thereof are omitted.

Referring to FIG. 6, the semiconductor package 600 may include a first package unit 610 on a redistribution structure 110. The first package unit 610 may include a semiconductor package having a fan-out wafer-level package (FOWLP) structure. The first package unit 610 may substantially have the same configuration as that of the package unit 10 described with reference to FIGS. 1A and 1B. However, the first package unit 610 may further include a plurality of conductive posts 620, which are around a semiconductor chip SC on a first surface 110A of the redistribution structure 110. Each of the conductive posts 620 may be connected to a wiring pattern 112 in a wiring structure WS of the redistribution structure 110. Each of the plurality of conductive posts 620 may include copper (Cu), without being limited thereto.

Each of the plurality of conductive posts 620 may be connected to the wiring structure WS in the redistribution structure 110 through a selected one of a plurality of wiring patterns 612 on the first surface 110A of the redistribution structure 110.

Respective spaces between the semiconductor chip SC and the plurality of conductive posts 620 may be filled with a molding layer 630. In some implementations, the molding layer 630 may include an epoxy-based material, a thermosetting material, a thermoplastic material, or a combination thereof. For example, the molding layer 630 may include an epoxy molding compound (EMC). In some implementations, the molding layer 630 may include an ajinomoto build-up film (ABF), Frame Retardant 4 (FR-4), bismaleimide triazine (BT), an EMC or a combination thereof.

An upper redistribution structure 640 may be on the first package unit 610. The upper redistribution structure 640 may include a plurality of insulating films 642, which are stacked in a vertical direction (Z direction), and a plurality of upper redistribution patterns 644, which pass one of the plurality of insulating films 642. The plurality of upper redistribution patterns 644 may include a plurality of conductive via patterns 644A and a plurality of conductive line patterns 644B. The plurality of conductive via patterns 644A may be connected to some of the plurality of conductive line patterns 644B in a vertical direction. The plurality of conductive via patterns 644A may be electrically insulated from some other ones of the plurality of conductive line patterns 644B by the plurality of insulating films 642.

In some implementations, at least some of the plurality of insulating films 642 may include the same material as each other. In some implementations, at least some of the plurality of insulating films 642 may include different materials from each other. For example, each of the plurality of insulating films 642 may include photosensitive polyimide (PSPI), silicon oxide, or silicon nitride.

In some implementations, the plurality of upper redistribution patterns 644 may include copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof.

A second package unit 680 may be on the upper redistribution structure 640. The second package unit 680 may include a semiconductor chip (not shown). A plurality of connection terminals 670 may be between the upper redistribution structure 640 and the second package unit 680. The plurality of connection terminals 670 may be electrically connected to the upper redistribution pattern 644 of the upper redistribution structure 640. The second package unit 680 may be electrically connected to the semiconductor chip SC, an external connection terminal 150, or both through an electrical path including any one of various combinations of the connection terminal 670, the upper redistribution structure 640, the conductive post 620, the redistribution structure 110, and the conductive pad 130.

In some implementations, the semiconductor chip SC in the first package unit 610 and the semiconductor chip in the second package unit 680 may be elements configured to perform different functions from each other. For example, the semiconductor chip SC may be a logic chip, and the semiconductor chip in the second package unit 680 may be a memory chip. The logic chip may be a microprocessor. For example, the logic chip may be a CPU, a controller, an ASIC or a combination thereof. The memory chip may include a volatile memory chip (e.g., DRAM or SRAM) or a non-volatile memory chip (e.g., PRAM, MRAM, FeRAM, or RRAM). In some implementations, the memory chip may be an HBM DRAM semiconductor chip.

In other implementations, the semiconductor chip SC in the first package unit 610 and the semiconductor chip in the second package unit 680 may be elements configured to substantially perform the same function. For example, at least one of the semiconductor chip SC in the first package unit 610 and the semiconductor chip in the second package unit 680 may be an AP chip of an SoC type, which is used in a mobile system (e.g., a mobile phone, an MP3 player, a navigation, and a PMP), or a DDR chip used in the mobile system.

In the semiconductor package 600, some of the plurality of conductive pads 130 may be connected to the semiconductor chip SC through the wiring structure WS in the redistribution structure 110, and some other ones of the plurality of conductive pads 130 may be connected to the conductive post 620 through the wiring structure WS in the redistribution structure 110. As used herein, from among the plurality of conductive pads 130, the conductive pad 130 connected to the semiconductor chip SC through the wiring structure WS included in the redistribution structure 110 may be referred to as a first conductive pad, and the conductive pad 130 connected to the conductive post 620 through the wiring structure WS included in the redistribution structure 110 may be referred to as a second conductive pad.

FIG. 7 is a cross-sectional view of an example of a semiconductor package 700. In FIG. 7, the same reference numerals are used to denote the same elements as in FIGS. 1A, 1B, 2, and 6, and detailed descriptions thereof are omitted.

Referring to FIG. 7, the semiconductor package 700 may substantially have the same configuration as that of the semiconductor package 600 described with reference to FIG. 6. However, the semiconductor package 700 may include a redistribution structure 210. The redistribution structure 210 may include a wiring structure WS2 and an insulating structure 214, which covers the wiring structure WS2 and includes a polymer. In addition, the semiconductor package 700 may include a plurality of conductive pads 230, which pass through a passivation insulating film 120 and are electrically connected to a wiring pattern 212 in the wiring structure WS2.

The insulating structure 214 may include first to fourth insulating layers 114A, 114B, 114C, and 214D, which are sequentially stacked on a first surface 210A of the redistribution structure 210. The fourth insulating layer 214D may include a first surface 214S1 in contact with the passivation insulating film 120 and a plurality of second surfaces 214S2, which are closer to the first surface 210A of the redistribution structure 210 than the first surface 214S1. Each of the plurality of second surfaces 214S2 may be in contact with an inner surface 230A of a conductive pad 230.

Each of the plurality of conductive pads 230 may protrude more than a second surface 210B of the redistribution structure 210 in a direction away from the passivation insulating film 120 and protrude more than an outer surface 120B of the passivation insulating film 120 in a direction away from the passivation insulating film 120. Details of the redistribution structure 210, the wiring pattern 212, and the plurality of conductive pads 230 may be the same as those described with reference to FIG. 2.

In other implementations, a plurality of wiring patterns 212 in the wiring structure WS2 of the redistribution structure 210 may include the outermost wiring pattern 312C described with reference to FIG. 3 instead of the outermost wiring pattern 212C that is in contact with the inner surface 230A of the conductive pad 230.

FIG. 8 is a cross-sectional view of an example of a semiconductor package 800. In FIG. 8, the same reference numerals are used to denote the same elements as in FIGS. 1A, 1B, 4, and 6, and detailed descriptions thereof are omitted.

Referring to FIG. 8, the semiconductor package 800 may substantially have the same configuration as that of the semiconductor package 600 described with reference to FIG. 6. However, the semiconductor package 800 may include a passivation insulating film 420 covering a second surface 110B of a redistribution structure 110. Each of a plurality of conductive pads 130 may pass through the passivation insulating film 420 and be electrically connected to a wiring pattern 112 in a wiring structure WS. Details of the passivation insulating film 420 may be the same as those described with reference to FIG. 4.

FIG. 9 is a cross-sectional view of an example of a semiconductor package 900. In FIG. 9, the same reference numerals are used to denote the same elements as in FIGS. 1A, 1B, 5, and 6, and detailed descriptions thereof are omitted.

Referring to FIG. 9, the semiconductor package 900 may substantially have the same configuration as that of the semiconductor package 600 described with reference to FIG. 6. However, the semiconductor package 900 may include a passivation insulating film 520 covering a second surface 110B of a redistribution structure 110. Each of a plurality of conductive pads 130 may pass through the passivation insulating film 520 and be electrically connected to a wiring pattern 112 in a wiring structure WS. Details of the passivation insulating film 520 may be the same as those described with reference to FIG. 5.

FIG. 10 is a cross-sectional view of an example of a semiconductor package 1000. In FIG. the same reference numerals are used to denote the same elements as in FIGS. 1A, 1B, and 6, and detailed descriptions thereof are omitted.

Referring to FIG. 10, the semiconductor package 1000 may include a first package unit 1010 on a redistribution structure 110. The first package unit 1010 may substantially have the same configuration as that of the package unit 10 described with reference to FIGS. 1A and 1B. However, the first package unit 1010 may include a semiconductor package having a fan out panel level package (FOPLP) structure. An upper redistribution structure 1040 may be on the first package unit 1010, and a second package unit 680 may be on the upper redistribution structure 1040.

The first package unit 1010 may include a frame 1020, a semiconductor chip SC10, and a molding layer 1030. In some implementations, the semiconductor chip SC10 may substantially have the same configuration as that of the semiconductor chip SC described with reference to FIG. 6. In some implementations, the semiconductor chip SC10 may include a CPU, a microprocessor unit (MPU), a graphics processor unit (GPU), or an AP. In some implementations, the semiconductor chip SC10 may include a controller semiconductor chip configured to control the second package unit 680.

In the first package unit 1010, the frame 1020 may include a plurality of connection pads 1022, a plurality of conductive through vias 124, and a plurality of cores 1026. The frame 1020 may include a printed circuit board (PCB). Each of the plurality of cores 1026 may have a structure defining a cavity 1020C and have a plate form having a square rim shape in a view from above (or on an X-Y plane in FIG. 10).

The plurality of connection pads 1022, the plurality of conductive through vias 1024, and the plurality of cores 1026 may have multilayered structures. Some of the plurality of connection pads 1022 may be connected to a wiring structure WS in the redistribution structure 110. Each of the conductive through vias 1024 may pass through one of the plurality of cores 1026 in a vertical direction (Z direction) and be connected to the connection pad 1022.

In some implementations, each of the plurality of cores 1026 may include a thermosetting resin, e.g., a phenol resin and an epoxy resin, a thermoplastic resin, e.g., polyimide, or an insulating material in which at least one resin selected from the resins described above is impregnated into a core material including inorganic filler, glass fiber, glass cloth, glass fabric, or a combination thereof. For example, each of the plurality of cores 1026 may include prepreg, ABF, FR4, tetrafunctional epoxy, polyphenylene ether, BT, epoxy/polyphenylene oxide, Thermount, cyanate ester, polyimide, a liquid crystal polymer, or a combination thereof.

In some implementations, each of the plurality of connection pads 1022 may include electrolytically deposited (ED) copper foil, rolled-annealed (RA) copper foil, stainless steel foil, aluminum foil, ultra-thin copper foil, sputtered copper, or copper alloys, without being limited thereto. In some implementations, each of the plurality of conductive through vias 1024 may include copper, nickel, stainless steel, beryllium copper, or a combination thereof, without being limited thereto.

The molding layer 1030 may include portions filling spaces between the plurality of cores 1026 and the semiconductor chip SC10 in the cavity 1020C defined by the plurality of cores 1026 and portions covering a top surface of each of the frame 1020 and the semiconductor chip SC10. A constituent material of the molding layer 1030 may be substantially the same as that of the molding layer 630, which has been described with reference to FIG. 6.

An upper redistribution structure 1040 may be on a first package unit 610. The upper redistribution structure 1040 may include a plurality of insulating films 1042, a plurality of upper redistribution patterns 1044, and a plurality of connection pads 1046. The plurality of insulating films 1042 may be stacked in the vertical direction (Z direction), and each of the plurality of upper redistribution patterns 1044 may pass through one of the plurality of insulating films 1042. The plurality of upper redistribution patterns 1044 may include a plurality of conductive via patterns 1044A and a plurality of conductive line patterns 1044B. The plurality of conductive via patterns 1044A may be connected to some of the plurality of conductive line patterns 1044B in a vertical direction. The plurality of conductive via patterns 1044A may be electrically insulated from some other ones of the plurality of conductive line patterns 1044B by the plurality of insulating films 1042. Details of the plurality of insulating films 1042 and the plurality of upper redistribution patterns 1044 may be the same as those of the plurality of insulating films 642 and the plurality of upper redistribution patterns 644, which have been described with reference to FIG. 6. In some implementations, the connection pad 1046 may include nickel (Ni), aluminum (Al), or a combination thereof, without being limited thereto.

A plurality of connection terminals 670 may be between the upper redistribution structure 1040 and the second package unit 680. Each of the plurality of connection terminals 670 may be connected to the upper redistribution pattern 1044 through the connection pad 1046.

Each of the plurality of connection terminals 670 may be electrically connected to the upper redistribution pattern 1044 of the upper redistribution structure 1040. The second package unit 680 may be electrically connected to the semiconductor chip SC10, an external connection terminal 150, or both through an electrical path including any one of various combinations of the connection terminal 670, the upper redistribution structure 1040, the plurality of connection pads 1022, a plurality of conductive through vias 124, the redistribution structure 110, and a conductive pad 130.

FIG. 10 illustrates an example in which the redistribution structure 110, the passivation insulating film 120, and the plurality of conductive pads 130 having the structures described with reference to FIG. 6 are between the semiconductor chip SC10 and a plurality of external connection terminals 150 in the semiconductor package 1000. In some implementations, the semiconductor package 1000 may include the redistribution structure 210 shown in FIG. 7 instead of the redistribution structure 110. In some implementations, the semiconductor package 1000 may include the passivation insulating film 420 shown in FIG. 8 or the passivation insulating film 520 shown in FIG. 9 instead of the passivation insulating film 120. In some implementations, the semiconductor package 1000 may include the plurality of conductive pads 230 shown in FIG. 7 instead of the plurality of conductive pads 130.

In the semiconductor packages 600, 700, 800, 900, and 1000 described with reference to FIGS. 6 to 10, like the semiconductor package 100 described with reference to FIGS. 1A and 1B, the insulating structures 114 and 214 in the redistribution structures 110 and 210 are covered by the passivation insulating films 120, 420, and 520. When the external connection terminals 150, which are electrically connectable to the wiring structures WS and WS2 in the redistribution structures 110 and 210, are formed during the manufacture of the semiconductor packages 600, 700, 800, 900, and 1000, a chemical material (e.g., an organic solvent in flux) may be prevented from penetrating the insulating structures 114 and 214 in the redistribution structures 110 and 210 by the passivation insulating films 120, 420, and 520. Accordingly, because the insulating structures 114 and 214 do not come into contact with the flux, the insulating structures 114 and 214 may be prevented from being chemically damaged by a chemical material derived from flux or physically damaged due to a lifting phenomenon, a peeling phenomenon, or both. Therefore, the reliability of the semiconductor packages 600, 700, 800, 900, and 1000 may be improved.

Next, a method of manufacturing a semiconductor package, according to implementations, will be described in detail with reference to specific examples.

FIGS. 11A to 11M are cross-sectional views illustrating, according to a process sequence, a method of manufacturing an example of a semiconductor package 600. A method of manufacturing the semiconductor package 600 shown in FIG. 6 will be described with reference to FIGS. 11A to 11M. In FIGS. 11A to 11M, the same reference numerals are used to denote the same elements as in FIGS. 1A, 1B, and 6, and detailed descriptions thereof are omitted.

Figure 11A:
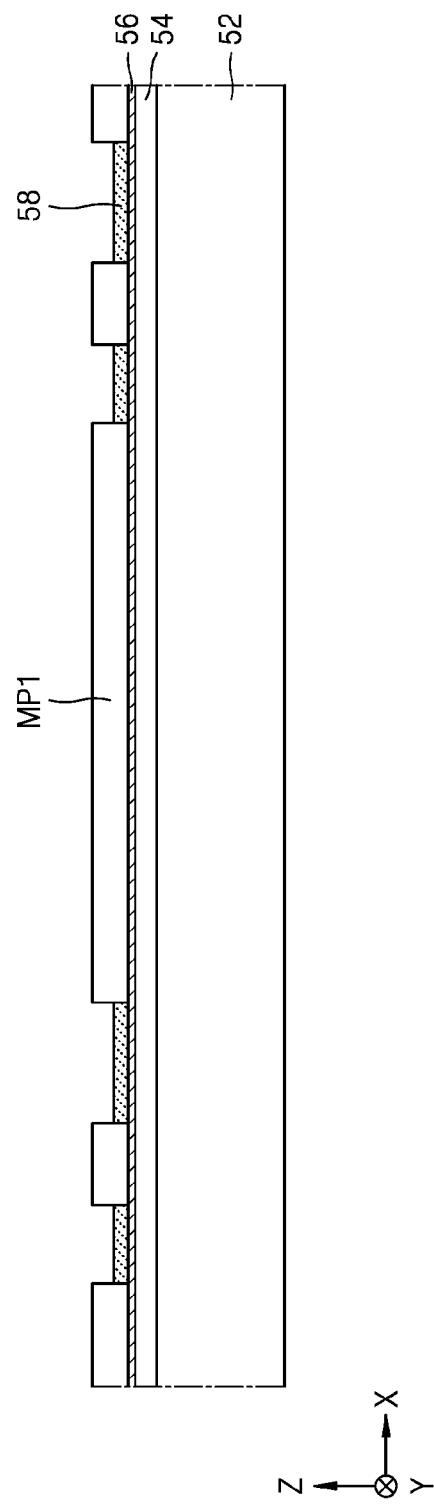

Referring to FIG. 11A, a tape substrate 52 to which an adhesive layer 54 is adhered may be prepared, and copper foil 56 may be adhered onto the adhesive layer 54. Therefore, a mask pattern MP1 may be formed on the copper foil 56, and a plurality of wiring patterns 58 may be formed on the copper foil 56, which is exposed through the mask pattern MP1.

In some implementations, each of the tape substrate 52 and the adhesive layer 54 may include an organic material. For example, the tape substrate 52 may include polyimide. The mask pattern MP1 may include a photoresist pattern. To form the plurality of wiring patterns 58, an electroplating process may be performed by using the copper foil 56 as an electrode.

Figure 11B:
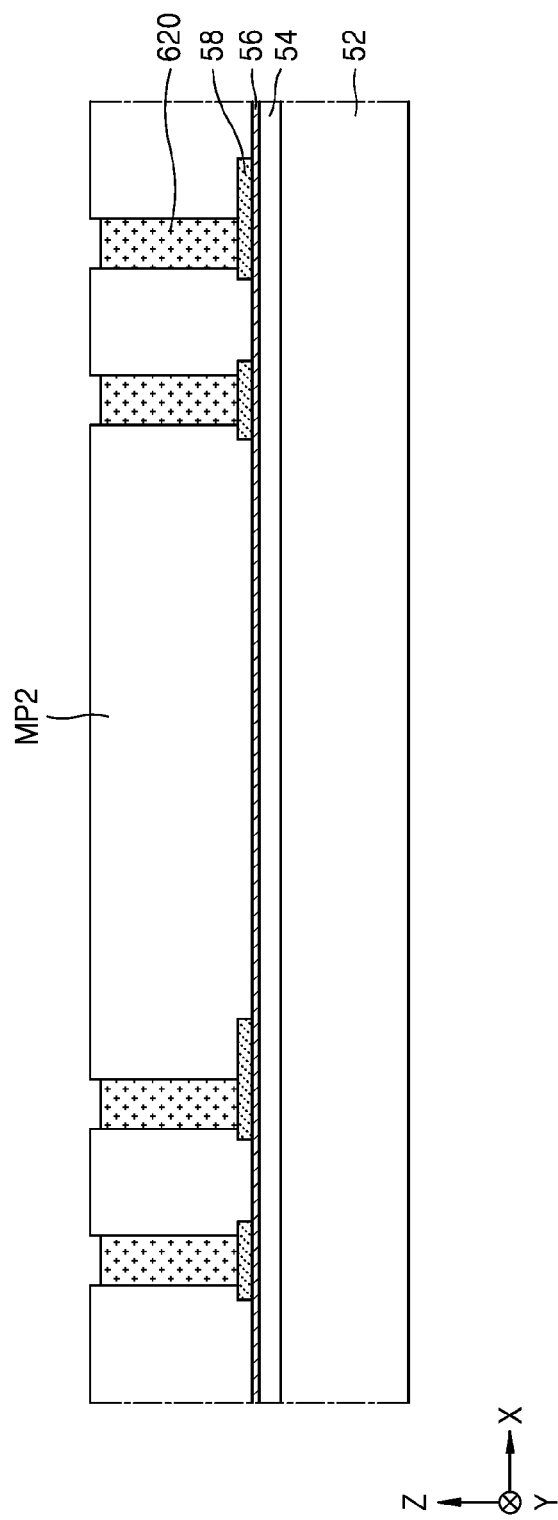

Referring to FIG. 11B, the mask pattern MP1 may be removed from the resultant structure of FIG. 11A, and a mask pattern MP2 having openings exposing respective portions of the plurality of wiring patterns 58 may be formed. Thereafter, a plurality of conductive posts 620 may be formed to respectively fill the openings.

In some implementations, the mask pattern MP2 may include a photoresist pattern. To form the plurality of conductive posts 620, an electroplating process may be performed by using the copper foil 56 as an electrode.

Figure 11C:
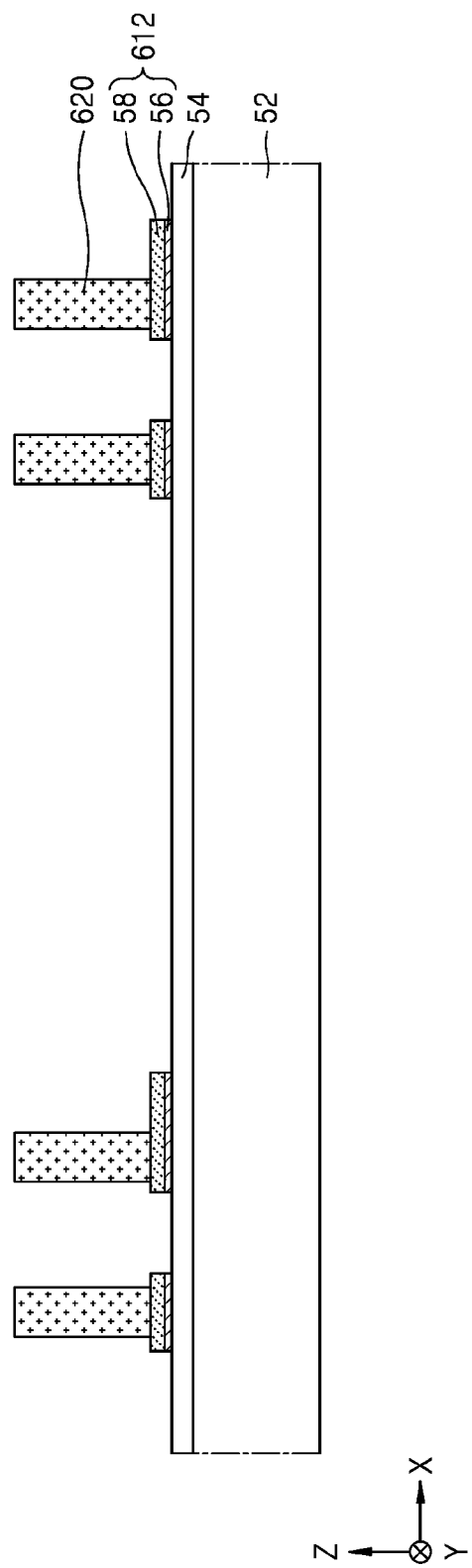

Referring to FIG. 11C, the mask pattern MP2 may be removed from the resultant structure of FIG. 11B, and the copper foil 56, which is exposed by removing the mask pattern MP2, may be etched. As a result, only portions of the copper foil 56, which are covered by the plurality of wiring patterns 58, may remain on the tape substrate 52. In some implementations, the copper foil 56 may be etched in a wet manner, without being limited thereto. After the portions of the copper foil 56 are etched, the adhesive layer 54 may be exposed. A stack structure of the copper foil 56 and the wiring pattern 58, which remain on the tape substrate 52, may constitute a wiring pattern 612. In the following drawings and descriptions, the stack structure of the copper foil 56 and the wiring pattern 58 will be illustrated and described as the wiring pattern 612.

Figure 11D:
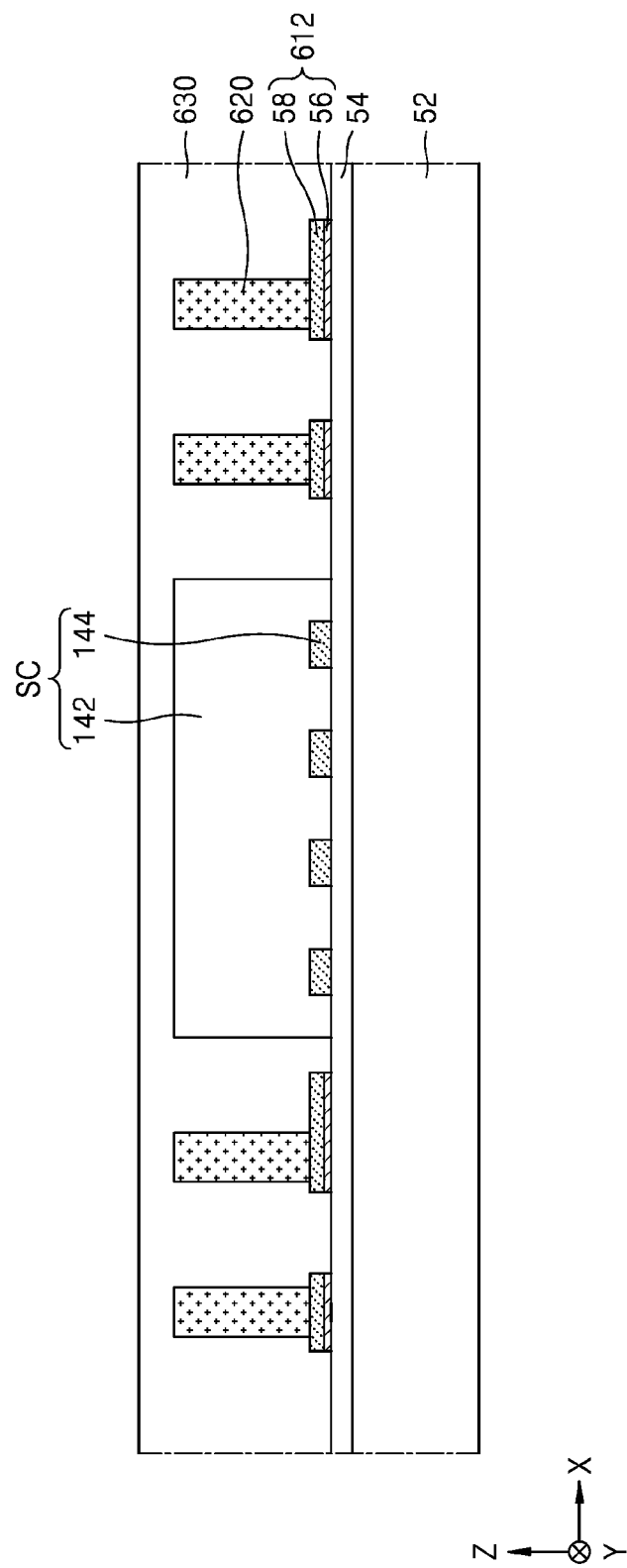

Referring to FIG. 11D, a semiconductor chip SC may be adhered onto the adhesive layer 54, which is exposed in the resultant structure of FIG. 11C. The semiconductor chip SC may be located such that an active surface thereof on which a plurality of chip pads 144 are located faces the adhesive layer 54. Afterwards, a molding layer 630 may be formed to cover the semiconductor chip SC and the plurality of conductive posts 620.

Figure 11E:
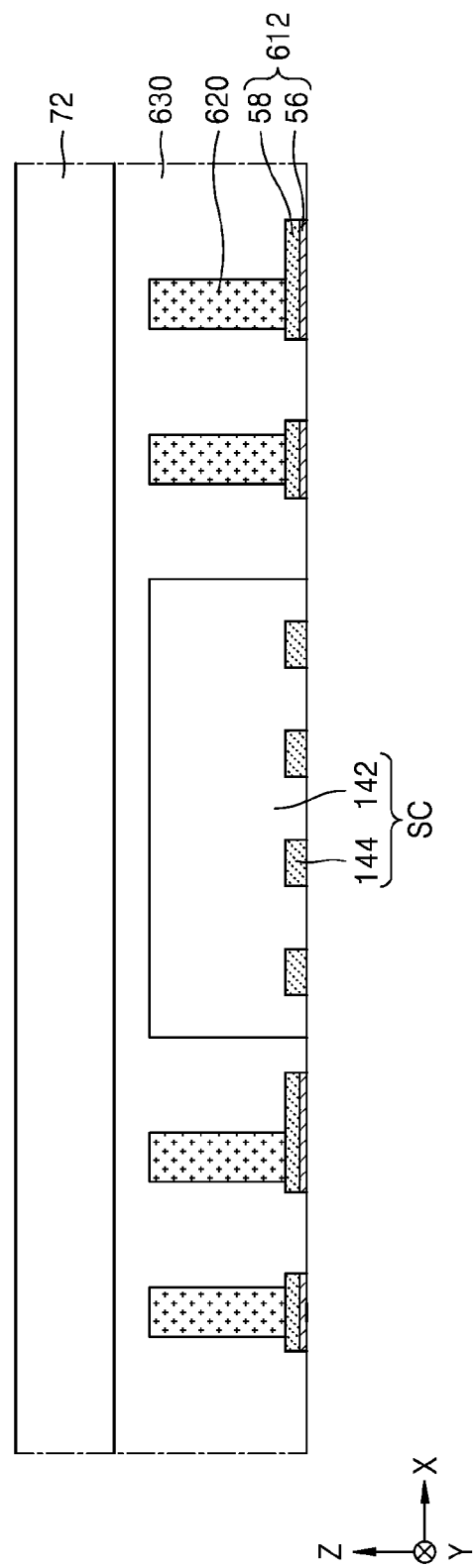

Referring to FIG. 11E, a first carrier substrate 72 may be adhered onto the molding layer 630 of the resultant structure of FIG. 11D. The first carrier substrate 72 may include any one of a glass substrate, a silicon substrate, and a metal substrate. Thereafter, the adhesive layer 54 and the tape substrate 52 may be exposed to expose the copper foil 56 of the wiring pattern 612 and the plurality of chip pads 144.

Figure 11F:
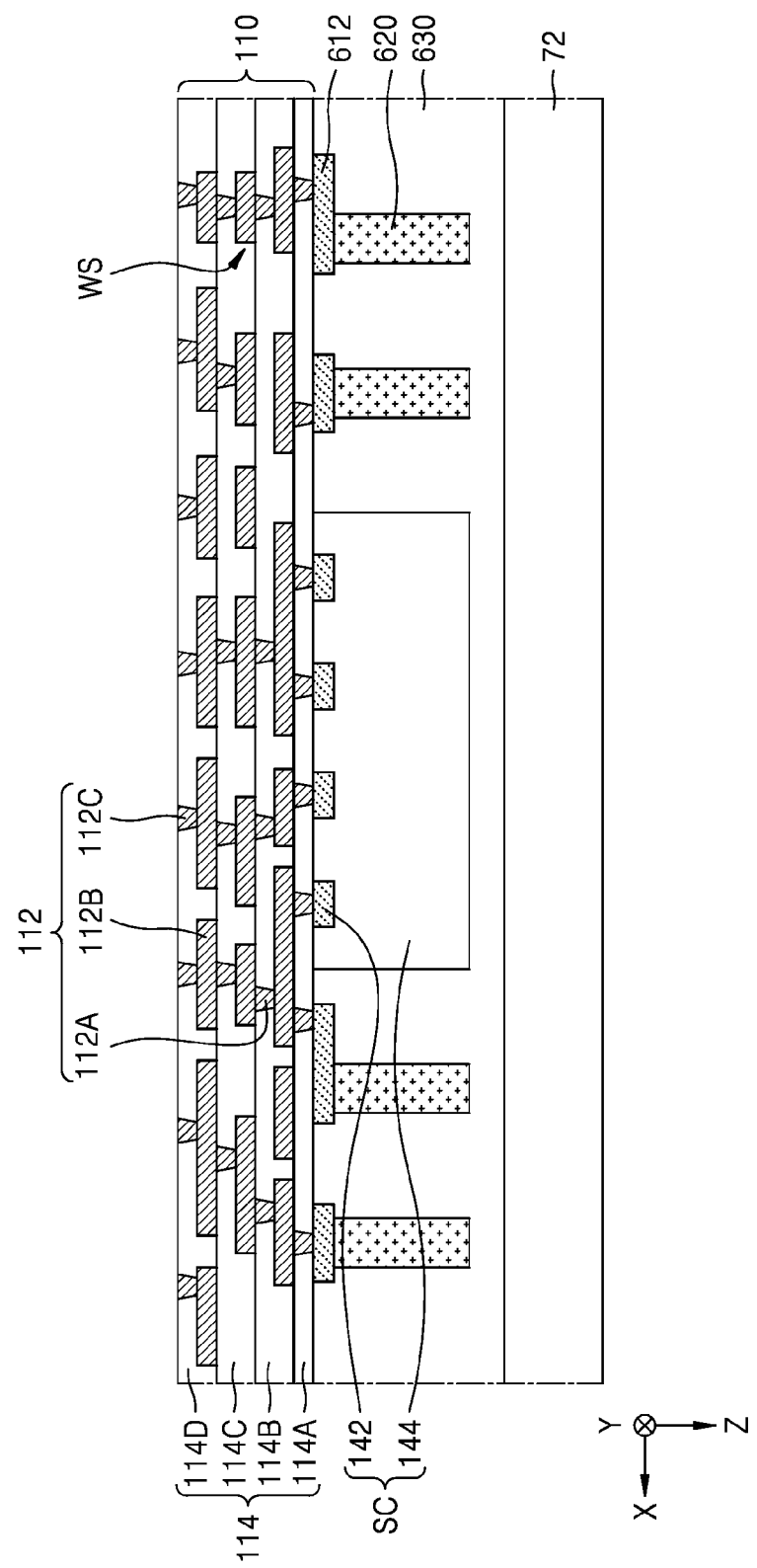

Referring to FIG. 11F, after the resultant structure of FIG. 11E is being turned over such that a plurality of wiring patterns 612 and the plurality of chip pads 144 face upward, a redistribution structure 110 may be formed on the plurality of wiring patterns 612 and the plurality of chip pads 144.

The formation of the redistribution structure 110 may include forming a first insulating layer 114A to cover the plurality of wiring patterns 612 and the plurality of chip pads 144, patterning the first insulating layer 114A, forming a conductive via pattern 112A and a conductive line pattern 112B, which constitute a portion of a wiring structure WS, on the first insulating layer 114A, which is patterned, forming a second insulating layer 114B on the obtained resultant structure, patterning the second insulating layer 114B, forming a conductive via pattern 112A and a conductive line pattern 112B, which constitute another portion of the wiring structure WS, on the second insulating layer 114B, which is patterned, forming a third insulating layer 114C on the obtained resultant structure, patterning the third insulating layer 114C, forming a conductive via pattern 112A and a conductive line pattern 112B, which constitute still another portion of the wiring structure WS, on the third insulating layer 114C, which is patterned, forming a fourth insulating layer 114D on the obtained resultant structure, patterning the fourth insulating layer 114D, and forming an outermost wiring pattern 112C, which constitutes yet another portion of the wiring structure WS, on a plurality of conductive line patterns 112B, which are exposed through the fourth insulating layer 114D, which is patterned. The first to fourth insulating layers 114A, 114B, 114C, and 114D may constitute an insulating structure 114 of the redistribution structure 110.

Figure 11G:
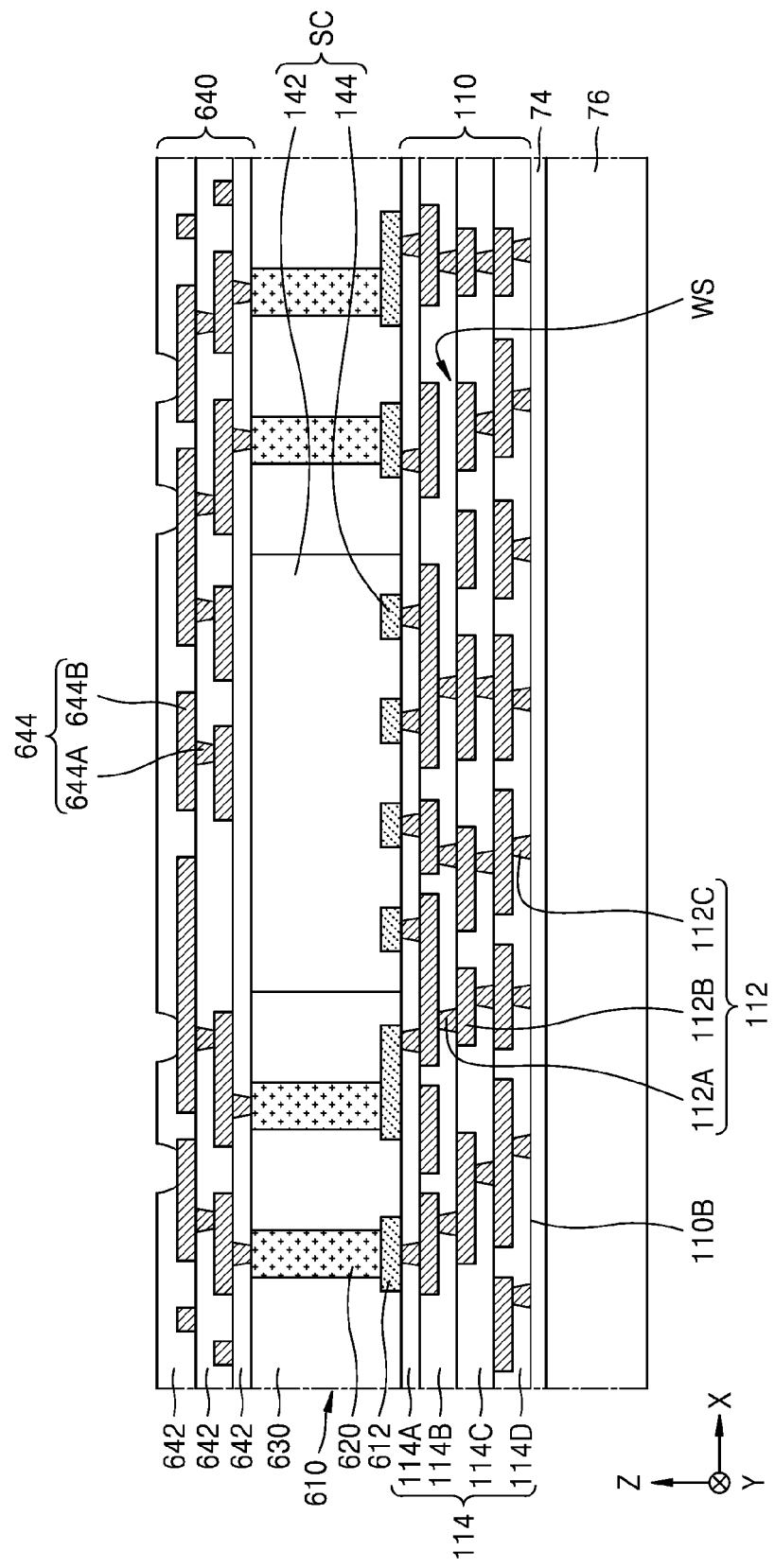

Referring to FIG. 11G, in the resultant structure of FIG. 11F, a second carrier substrate 76 may be adhered onto the redistribution structure 110 by using an adhesive layer 74. The second carrier substrate 76 may include a glass substrate, a silicon substrate, a metal substrate, or a combination thereof.

Afterwards, the first carrier substrate 72 may be removed, and an exposed surface of the molding layer 630 may be planarized to expose top surfaces of the plurality of conductive posts 620. Thereafter, an upper redistribution structure 640 may be formed on the semiconductor chip SC, the plurality of conductive posts 620, and the molding layer 630. To form the upper redistribution structure 640, processes similar to the processes of forming the redistribution structure 110, which have been described with reference to FIG. 11F, may be performed.

Figure 11H:
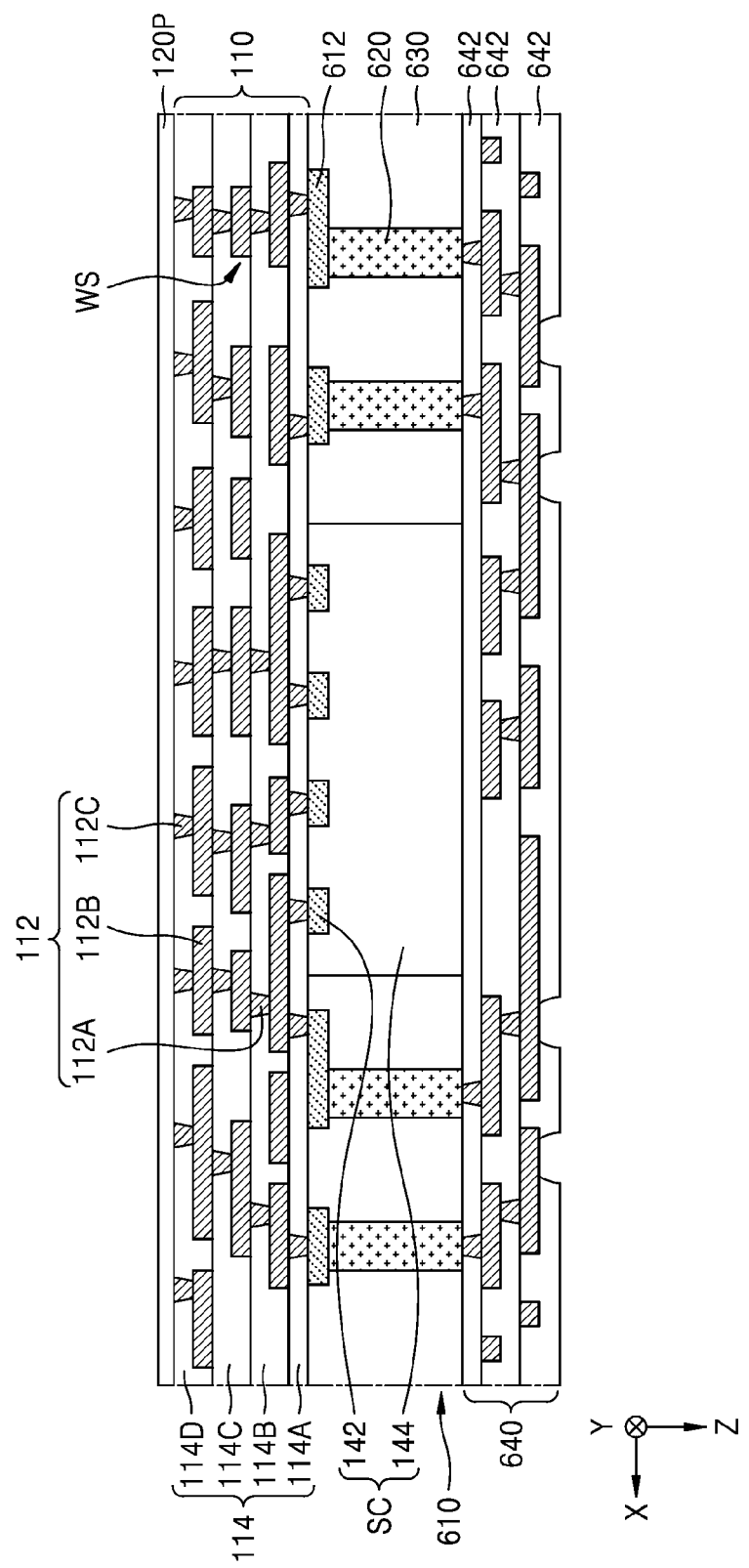

Referring to FIG. 11H, the second carrier substrate 76 and the adhesive layer 74 may be removed from the resultant structure of FIG. 11G, and thus, the insulating structure 114 and the plurality of outermost wiring patterns 112C of the redistribution structure 110 may be exposed. Afterwards, a preliminary passivation insulating film 120P may be formed to cover the insulating structure 114 and the plurality of outermost wiring patterns 112C.

The preliminary passivation insulating film 120P may include an inorganic insulating material having a dielectric constant of about 7.5 or less. In some implementations, the preliminary passivation insulating film 120P may include a silicon oxide film, a silicon nitride film, or a combination thereof. The silicon oxide film may include a $SiO_2$ film. The silicon nitride film may include a $Si_3N_4$ film. The preliminary passivation insulating film 120P may have a thickness selected in a range of about 50 nm to about 500 nm, without being limited thereto.

Figure 11I:
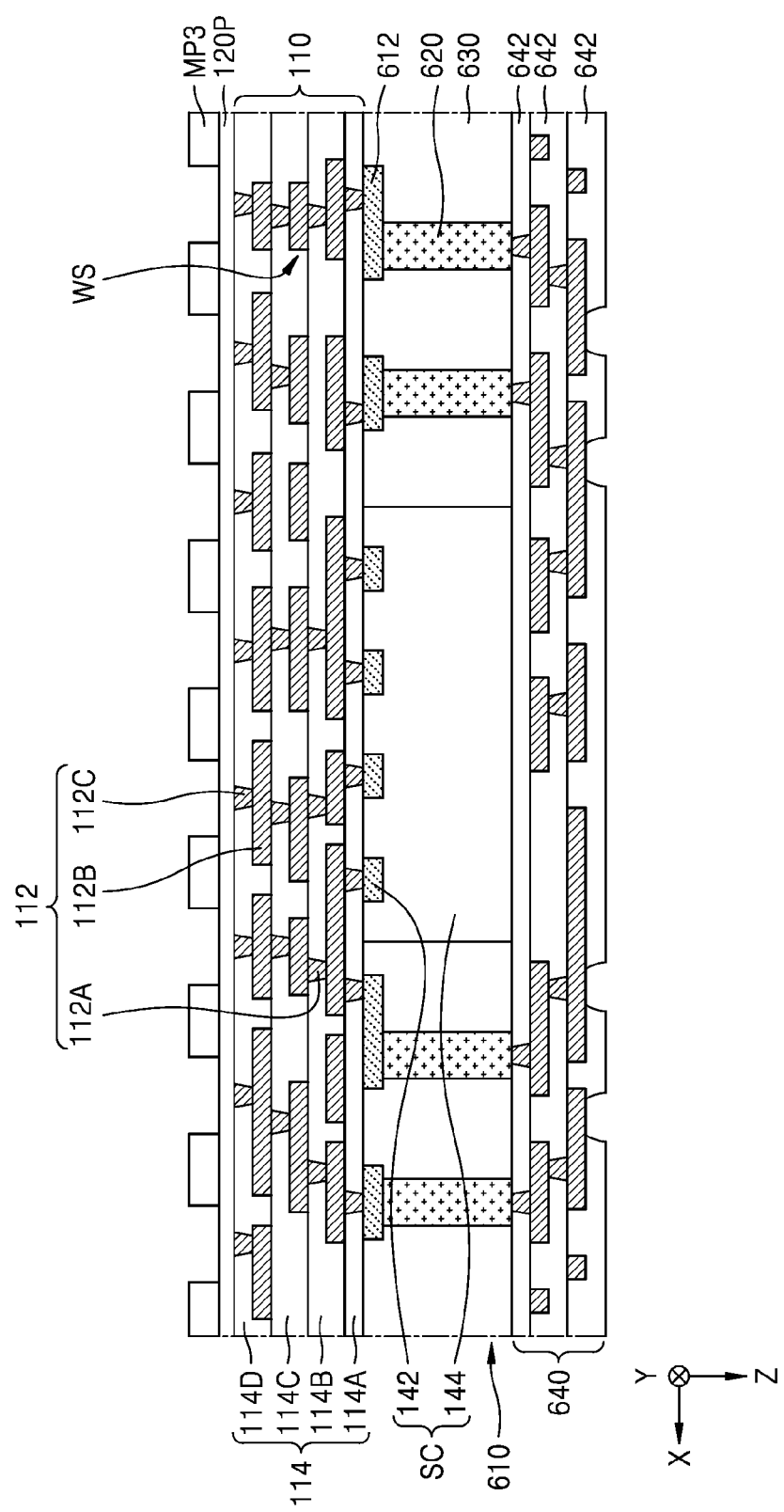

Referring to FIG. 11I, in the resultant structure of FIG. 11G, a mask pattern MP3 may be formed on the preliminary passivation insulating film 120P.

In some implementations, the mask pattern MP3 may include a photoresist pattern. The photoresist pattern may include a (meth)acrylate copolymer, a styrenic copolymer, a base-soluble resin (binder resin) using novolak as a base, a crosslinking agent, and a photo-radical generator. To form the mask pattern MP3, a photoresist film may be formed and then exposed, and thus, the photo-radical generator in an exposed area of the photoresist film may generate reactive radicals, thus causing a crosslinking reaction in the exposed area. Accordingly, the exposed area of the photoresist film may be made insoluble in a developer. The exposure process may be performed by using i-line (365 nm), 248-nm irradiation, 193-nm irradiation, extreme ultraviolet (EUV) light, or electron beams, without being limited thereto. Thereafter, the mask pattern MP3 may be formed by removing a non-exposed area of the photoresist film by using a developer. The developer may include 2.38% by weight of a tetramethylammonium hydroxide (TMAH) water solution, without being limited thereto.

Figure 11J:
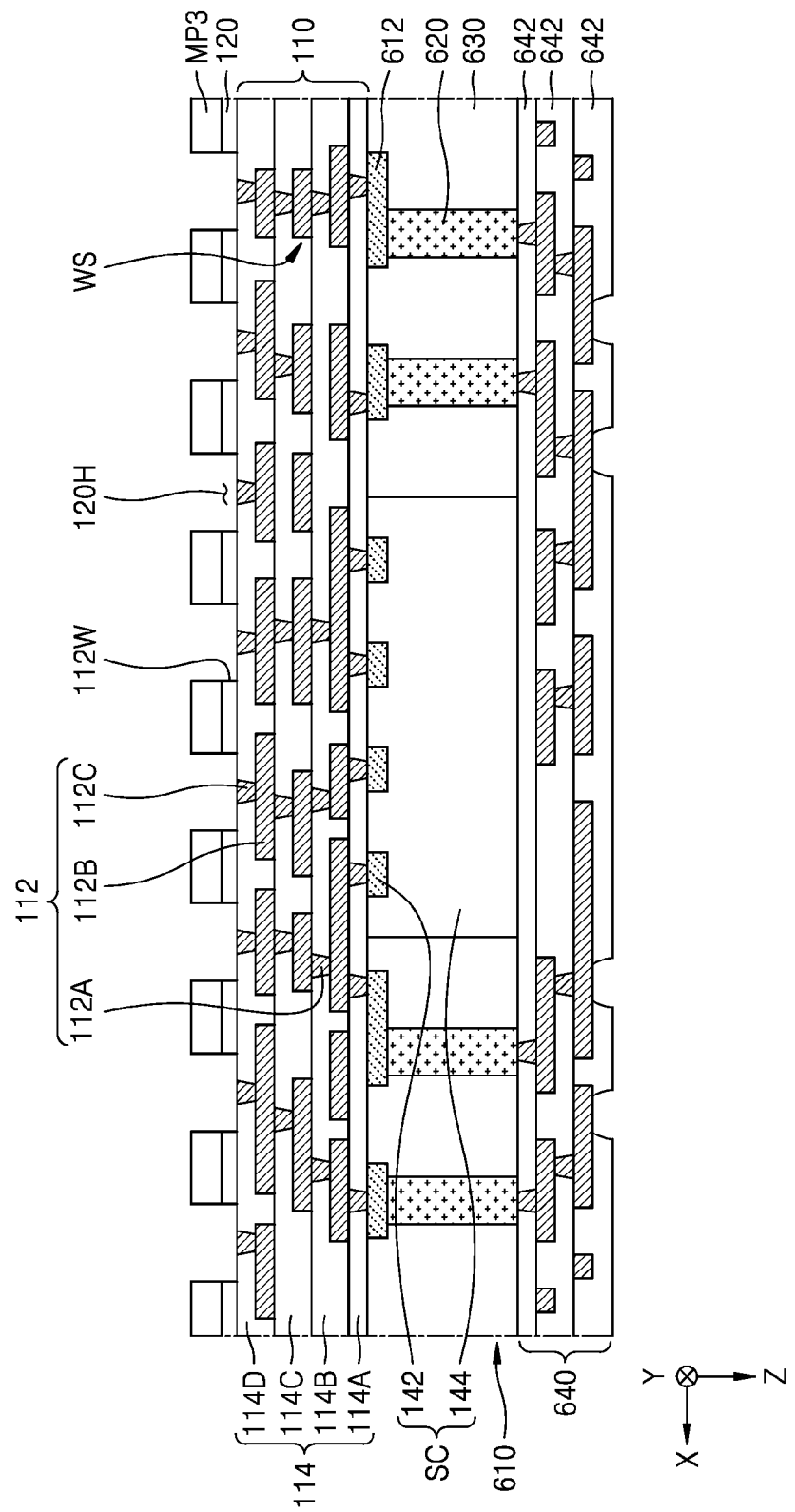

Referring to FIG. 11J, in the resultant structure of FIG. 11I, the preliminary passivation insulating film 120P may be etched by using the mask pattern MP3 as an etch mask, and thus, a passivation insulating film 120 may be formed. The passivation insulating film 120 may have a plurality of holes 120H, which expose the fourth insulating layer 114D of the insulating structure 114 and the outermost wiring pattern 112C. A hole sidewall 120W of the passivation insulating film 120 may be exposed inside each of the plurality of holes 120H.

Figure 11K:
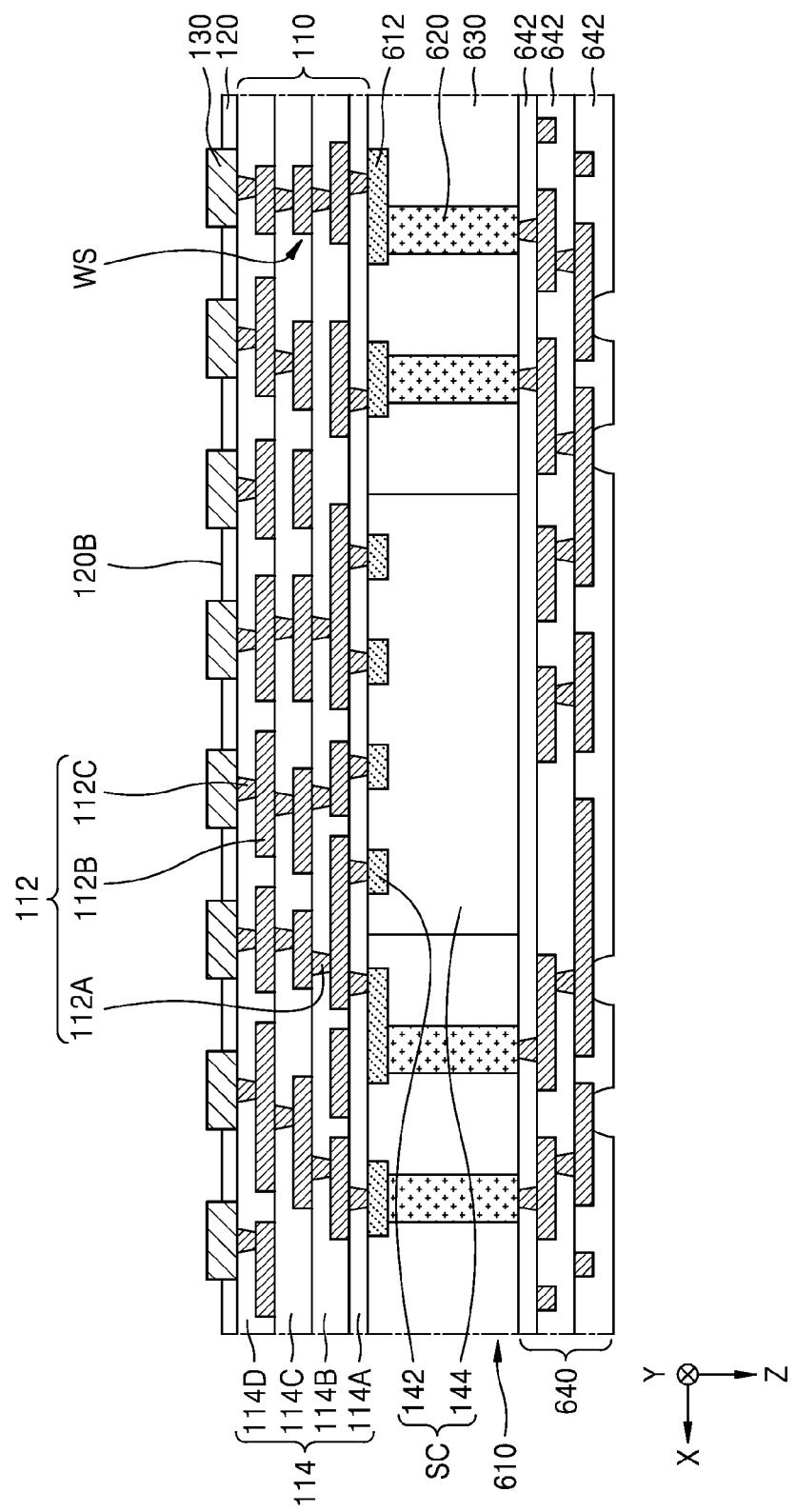

Referring to FIG. 11K, the mask pattern MP3 may be removed from the resultant structure of FIG. 11J to expose an outer surface 120B of the passivation insulating film 120. A plurality of conductive pads 130 filling the plurality of holes 120H and protruding over the outer surface 120B of the passivation insulating film 120 may be formed.

After the plurality of conductive pads 130 are formed, there may be no spaces between the plurality of conductive pads 130 and the passivation insulating film 120 such that the insulating structure 114 is not exposed through the plurality of holes 120H of the passivation insulating film 120.

Figure 11L:
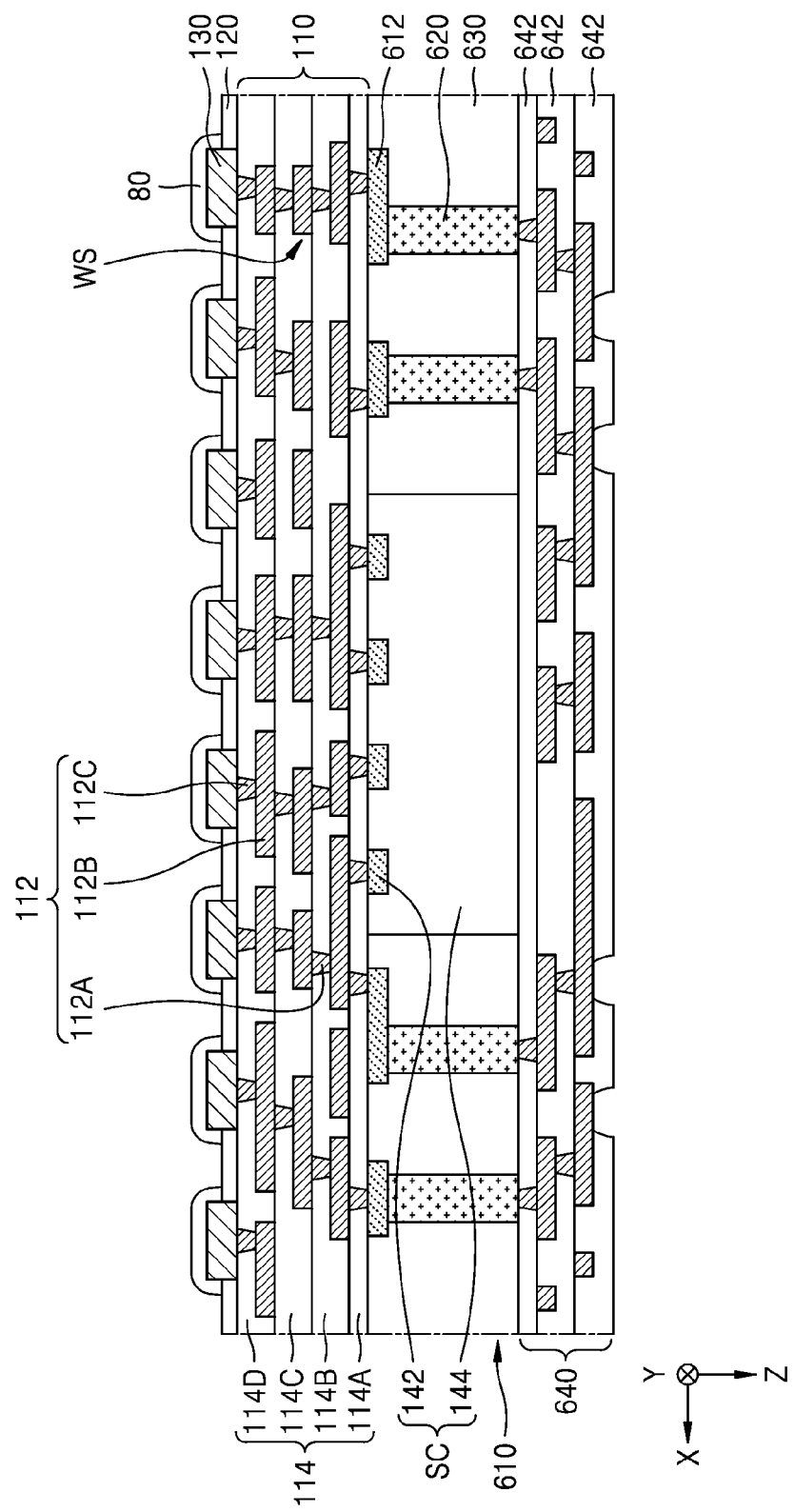

Referring to FIG. 11L, in the resultant structure of FIG. 11K, flux 80 may be applied onto the plurality of conductive pads 130. The flux 80 may be in contact with respective exposed surfaces of the plurality of conductive pads 130 and regions of the passivation insulating film 120, which are respectively adjacent to the plurality of conductive pads 130. Because the insulating structure 114 in the redistribution structure 110 is covered by the passivation insulating film 120 and the plurality of conductive pads 130, the flux 80 may be in contact with the insulating structure 114.

The flux 80 may remove undesired oxides that may remain on the plurality of conductive pads 130. In addition, the flux 80 may prevent the reoxidation of pure metal during a reflow process for forming a plurality of external connection terminals 150, which will be described below with reference to FIG. 11M. The flux 80 may include a material including a resin-based material as a main component. In some implementations, the flux 80 may include an inorganic flux including metal salts and inorganic acids, a water-soluble flux including a water-soluble solvent (e.g., poly-ethylene glycol), or a resin-based flux including a resin (e.g., rosin) as a main material. In other implementations, the flux 80 may include an activator, which includes an organic acid, an amine compound, an amine-halogen salt, or a combination thereof. The flux 80 may include a solvent including ethylene glycol ether, ethylene glycol, glycol acetate, aromatic alcohol, or a combination thereof.

As a comparative example, the process of forming the passivation insulating film 120 to cover the insulating structure 114 may be omitted. When the flux 80 is applied onto the plurality of conductive pads 130 in the process described with reference to FIG. 11L, the flux 80 may also be brought into contact with the insulating structure 114. When the insulating structure 114 includes a PID, the insulating structure 114 may include a polymer having a hydrophilic group. In this case, a solvent in the flux 80 may penetrate the insulating structure 114. In the above-described state, when a reflow process is performed in a relatively high-temperature atmosphere to form the plurality of external connection terminals 150, the insulating structure 114 may be chemically damaged by components, e.g., a glycol-based solvent, of the flux 80, which has penetrated the insulating structure 114, or physically damaged due to a lifting phenomenon, a peeling phenomenon, or both.

In some methods of manufacturing the semiconductor package, when the flux 80 is applied onto the plurality of conductive pads 130, because the insulating structure 114 is covered by the passivation insulating film 120, the flux 80 may be prevented from penetrating the insulating structure 114 by the passivation insulating film 120. Thus, the passivation insulating film 120 can prevent chemical damage, physical damage, or both by the flux 80 to the insulating structure 114.

Figure 11M:
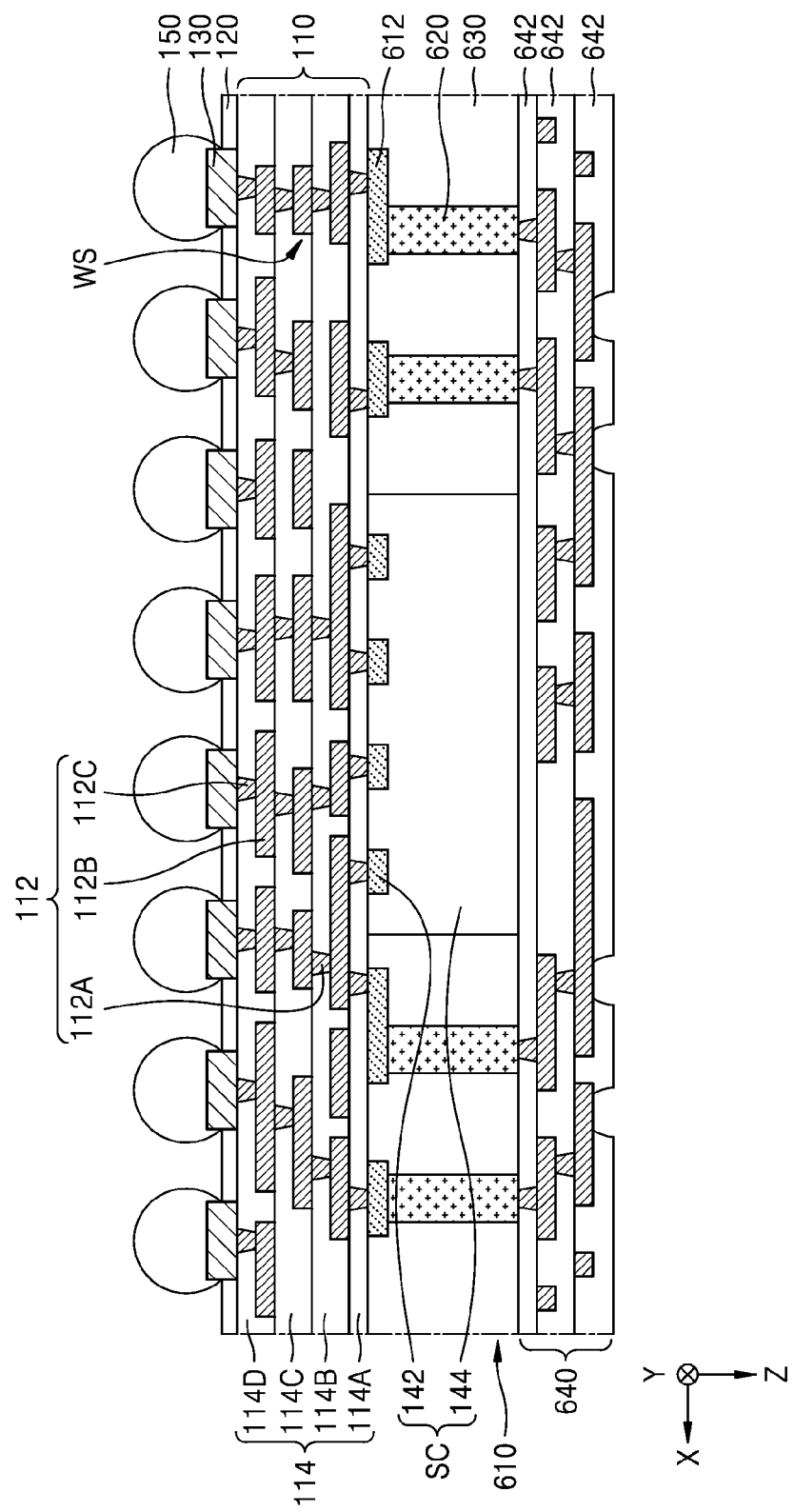

Referring to FIG. 11M, in the resultant structure of FIG. 11L, a plurality of external connection terminals 150 may be formed on the plurality of conductive pads 130.

In some implementations, to form the plurality of external connection terminals 150, a plurality of solder balls may be brought into contact with the flux 80 in the resultant structure of FIG. 11L and heated to a temperature higher than or equal to a melting point thereof, and thus, the plurality of solder balls may be reflowed. After the plurality of external connection terminals 150 are formed, residues of the flux 80 around the plurality of external connection terminals 150 may be removed with a cleaning process.

Thereafter, as shown in FIG. 6, in the resultant structure of FIG. 1M, a plurality of connection terminals 670 may be formed on the upper redistribution structure 640, and the second package unit 680 may be adhered onto the plurality of connection terminals 670. Thus, the semiconductor package 600 may be formed.

FIGS. 12A to 12D are cross-sectional views illustrating, according to a process sequence, a method of manufacturing an example of a semiconductor package 700. An example method of manufacturing the semiconductor package 700 shown in FIG. 7 will be described with reference to FIGS. 12A to 12D. FIGS. 12A to 12D each illustrate an enlarged cross-sectional configuration of a portion corresponding to portion "EX7" of FIG. 7. In FIGS. 12A to 12D, the same reference numerals are used to denote the same elements as in FIGS. 1A, 1B, 7, and 11A to 11M, and detailed descriptions thereof are omitted.

Figure 12A:
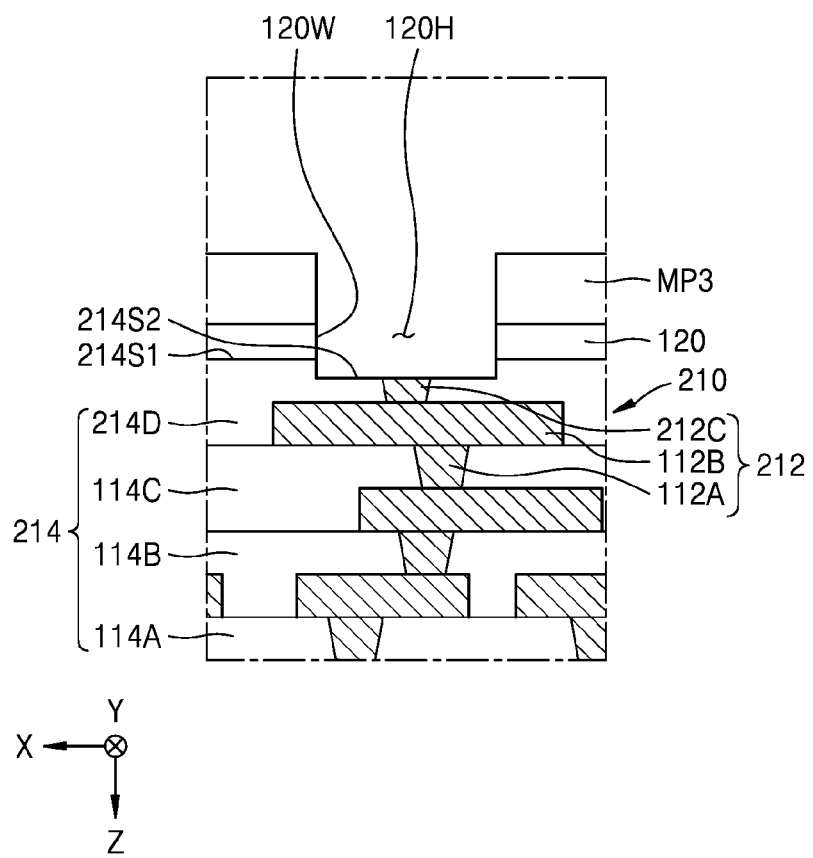

Referring to FIG. 12A, the processes described with reference to FIGS. 11A to 11J may be performed. However, in a manner similar to that described with reference to FIG. 11J, by controlling an etch selectivity of a film to be etched and an etch end time point in an etching atmosphere when a preliminary passivation insulating film 120P is etched, after the passivation insulating film 120 is formed, an insulating structure 214 and a portion of each of the plurality of outermost wiring patterns 212C, which are exposed through a plurality of holes 120H, may be further etched. As a result, the insulating structure 214 and a plurality of wiring patterns 212 may be obtained. The insulating structure 214 may include a fourth insulating layer 214D, which has a first surface 214S in contact with the passivation insulating film 120 and a second surface 214S2 that is recessed from the first surface 214S1. The plurality of wiring patterns 212 may include an outermost wiring pattern 212C.

Figure 12B:
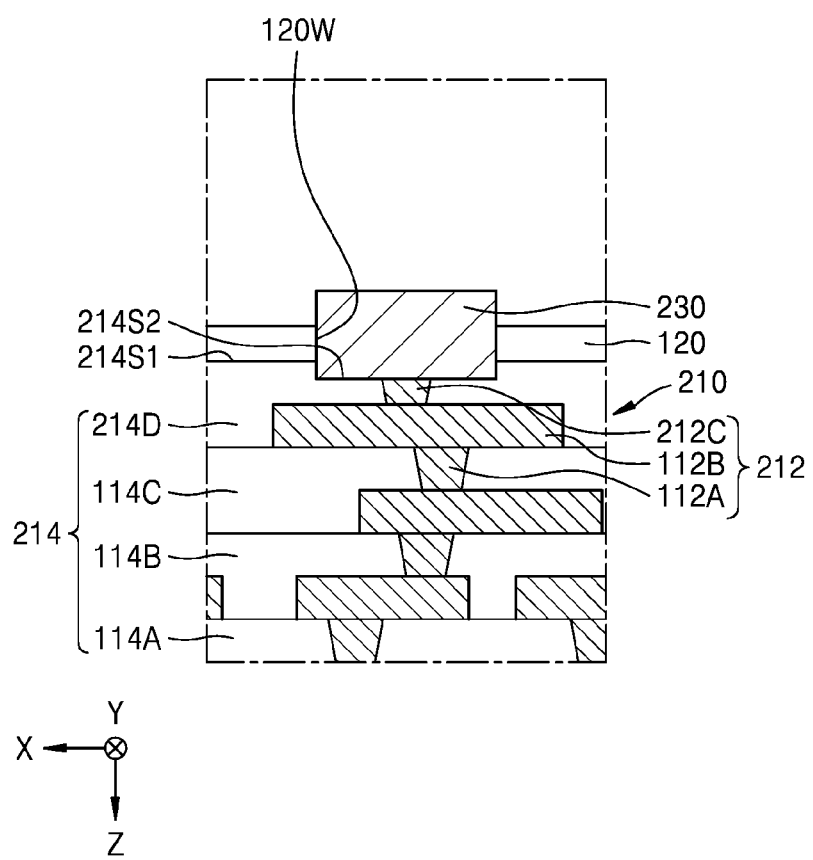

Referring to FIG. 12B, in a manner similar to that described with reference to FIG. 11K, the mask pattern MP3 may be removed from the resultant structure of FIG. 12A to expose the passivation insulating film 120, and a plurality of conductive pads 230 may be formed to fill the plurality of holes 120H and cover the second surface 214S2 of the fourth insulating layer 214D.

Figure 12C:
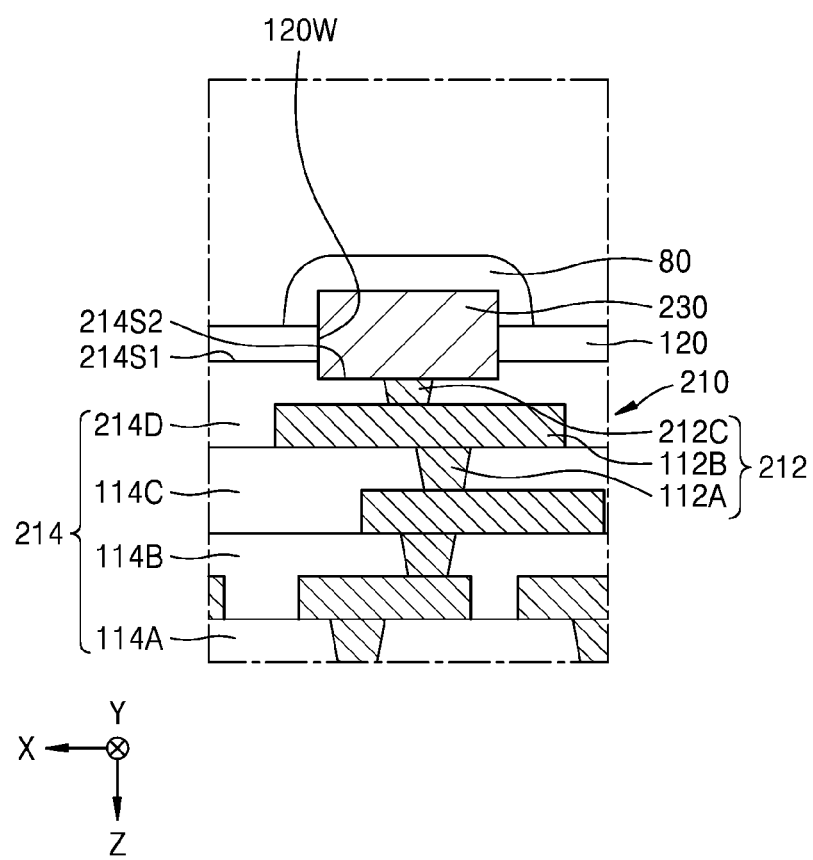

Referring to FIG. 12C, in a manner similar to that described with reference to FIG. 11, the flux 80 may be applied onto the plurality of conductive pads 230. In this case, because the insulating structure 214 is covered by the passivation insulating film 120 and the plurality of conductive pads 230, the flux 80 may not be in contact with the insulating structure 214.

Figure 12D:
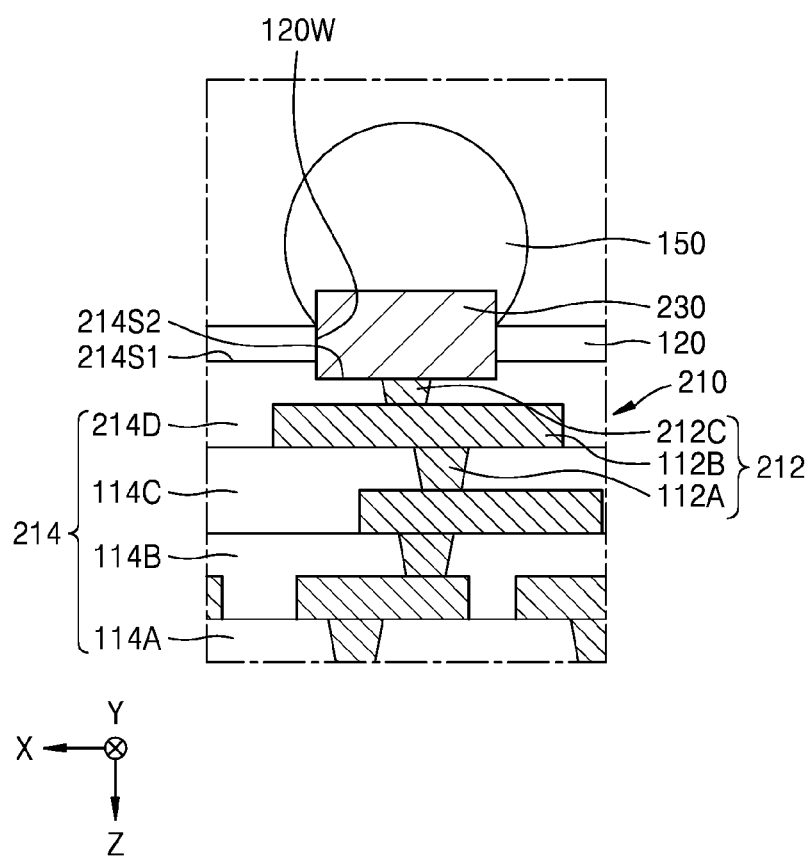

Referring to FIG. 12D, in a manner similar to that described with reference to FIG. 11M, the plurality of external connection terminals 150 may be formed on the plurality of conductive pads 130 in the resultant structure of FIG. 12C. Thus, the semiconductor package 700 shown in FIG. 7 may be manufactured.

FIGS. 13A to 13F are cross-sectional views illustrating, according to a process sequence, a method of manufacturing an example of a semiconductor package. Another method of manufacturing the semiconductor package 600 shown in FIG. 6 will be described with reference to FIGS. 13A to 13F. FIGS. 13A to 13F each illustrate an enlarged cross-sectional configuration of a portion corresponding to portion "EX6" of FIG. 6. In FIGS. 13A to 13F, the same reference numerals are used to denote the same elements as in FIGS. 1A, 1B, 6, and 11A to 11M, and detailed descriptions thereof are omitted.

Figure 13A:
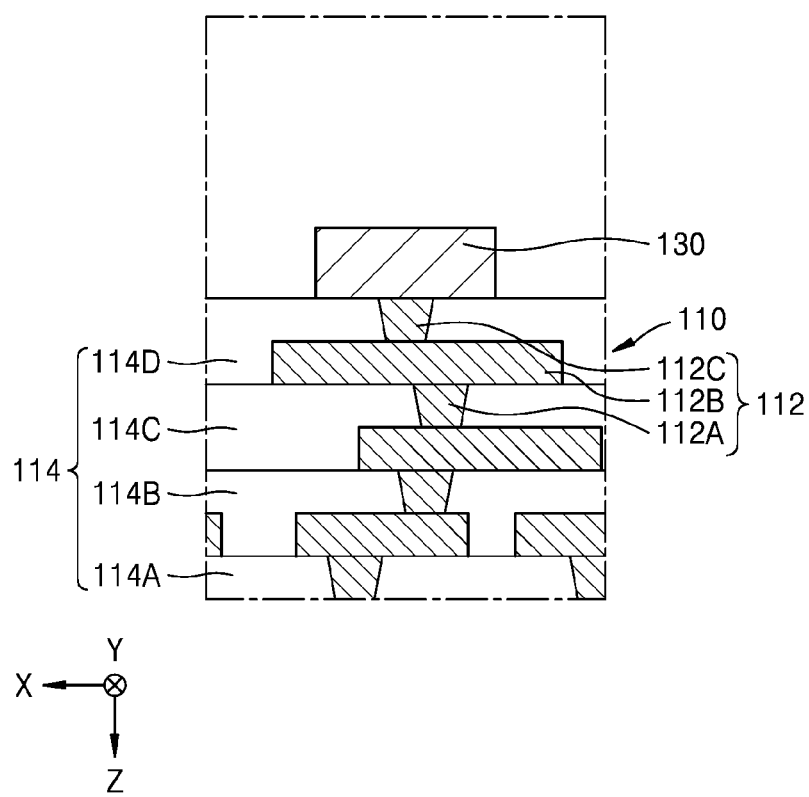

Referring to FIG. 13A, the processes described with reference to FIGS. 11A to 11G may be performed, and the second carrier substrate 76 and the adhesive layer 74 may be removed from the resultant structure of FIG. 11G. Thus, an insulating structure 114 and a plurality of outermost wiring patterns 112C of the redistribution structure 110 may be exposed. Thereafter, in a manner similar to that described with reference to FIG. 11K, a plurality of conductive pads 130 may be formed on the plurality of outermost wiring patterns 112C, which are exposed. Each of the plurality of conductive pads 130 may be formed to cover a partial surface of a fourth insulating layer 114D around the outermost wiring pattern 112C.

Figure 13B:
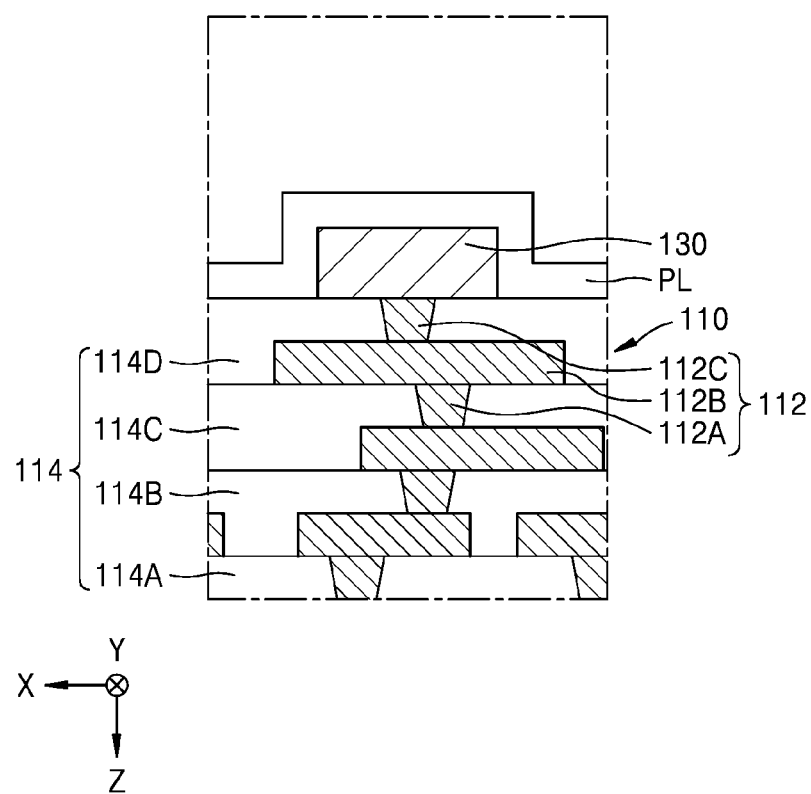

Referring to FIG. 13B, in a manner similar to that described with reference to FIG. 11H, a preliminary passivation insulating film PL may be formed to cover exposed surfaces of the insulating structure 114 and the plurality of conductive pads 130 on the resultant structure of FIG. 13A. Details of the preliminary passivation insulating film PL may be the same as those of the preliminary passivation insulating film 120P, which have been described with reference to FIG. 11H. The preliminary passivation insulating film PL may have a plurality of bent portions due to the plurality of conductive pads 130.

Figure 13C:
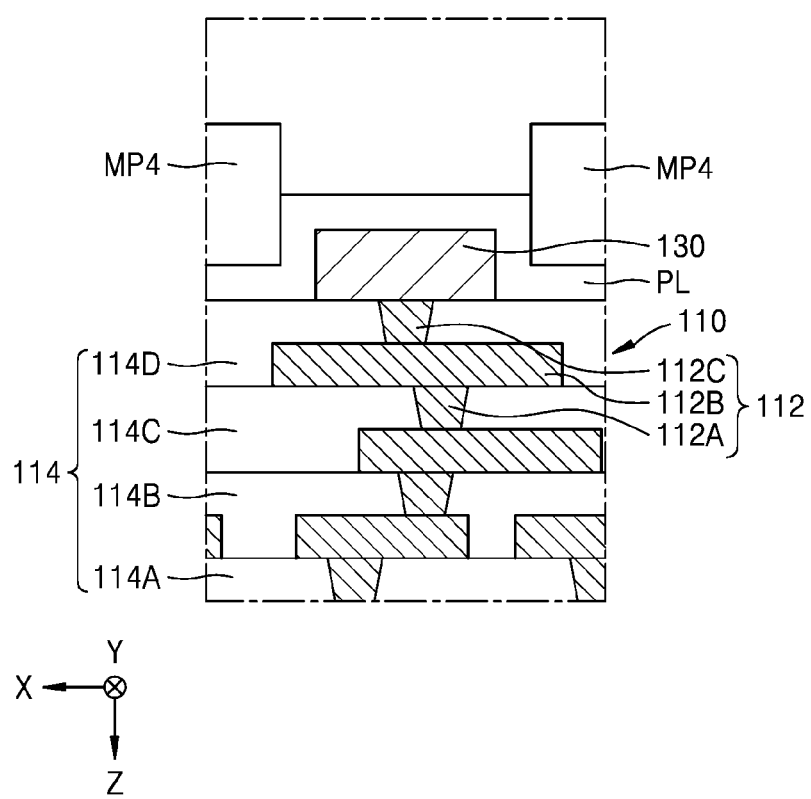

Referring to FIG. 13C, in a manner similar to that described with reference to FIG. 11I, a mask pattern MP4 may be formed on the preliminary passivation insulating film PL in the resultant structure of FIG. 13B. Details of the mask pattern MP4 may be substantially the same as those of the mask pattern MP3, which have been described with reference to FIG. 11I. The mask pattern MP4 may be formed to completely cover a relatively low step portion of the preliminary passivation insulating film PL, which is adjacent to the conductive pad 130, and partially cover a relatively high step portion of the preliminary passivation insulating film PL, which is on the conductive pad 130.

Figure 13D:
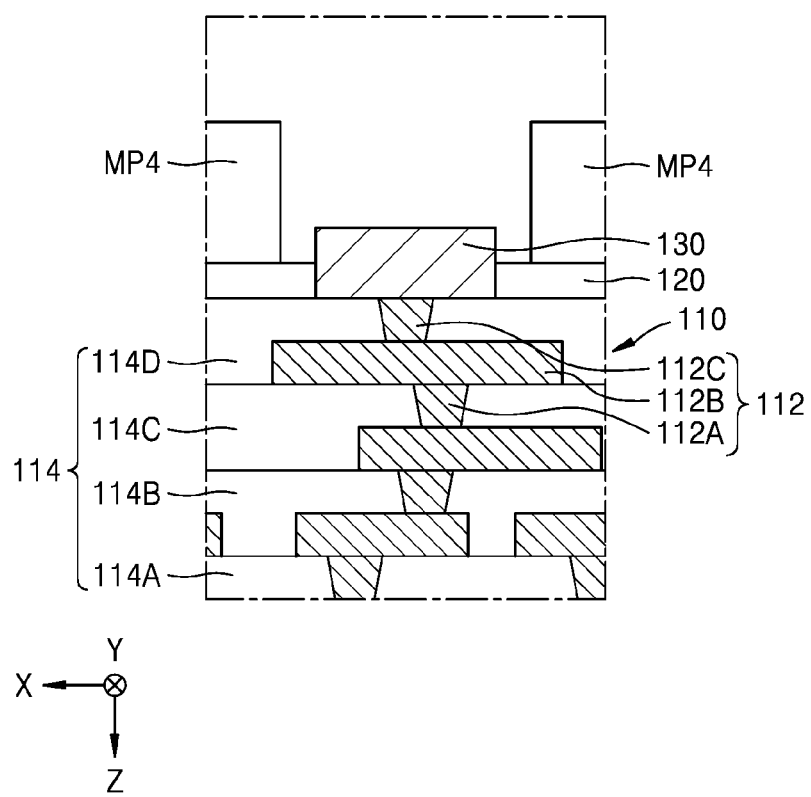

Referring to FIG. 13D, in a manner similar to that described with reference to FIG. 11J, the preliminary passivation insulating film PL may be etched by using the mask pattern MP4 as an etch mask in the resultant structure of FIG. 13C, and thus, the conductive pad 130 may be exposed and a passivation insulating film 120 may be formed.

By controlling an etch selectivity of a film to be etched and an etch end time point in an etching atmosphere when the preliminary passivation insulating film PL is etched, after the passivation insulating film 120 is formed, the insulating structure 114 may not be exposed between the passivation insulating film 120 and the conductive pad 130.

Figure 13E:
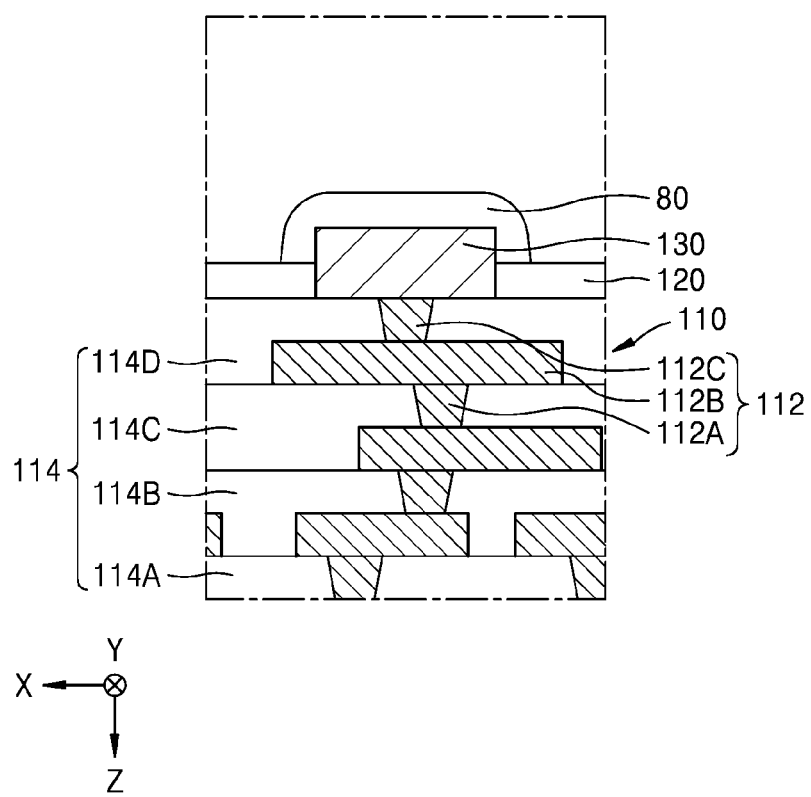

Referring to FIG. 13E, the mask pattern MP4 may be removed from the resultant structure of FIG. 13D, and flux 80 may be then applied onto the conductive pad 230 in a manner similar to that described with reference to FIG. 11L.

Figure 13F:
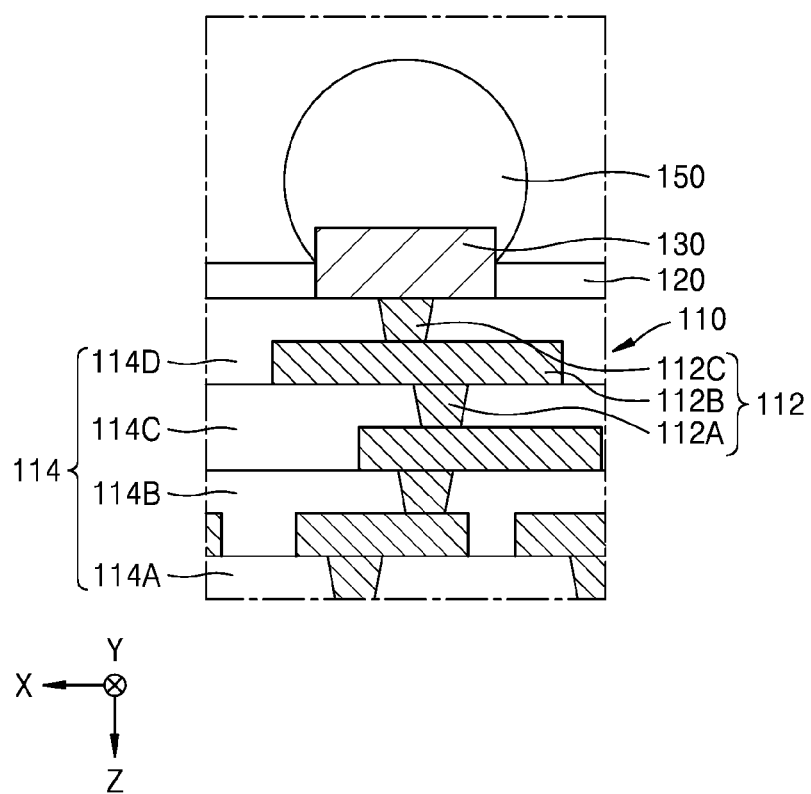

Referring to FIG. 13F, in a manner similar to that described with reference to FIG. 11M, a plurality of external connection terminals 150 may be formed on the plurality of conductive pads 130 in the resultant structure of FIG. 13E, and thus, the semiconductor package 600 shown in FIG. 6 may be manufactured.

FIGS. 14A to 14C are cross-sectional views illustrating, according to a process sequence, a method of manufacturing an example of a semiconductor package 800. An example method of manufacturing the semiconductor package 800 shown in FIG. 8 will be described with reference to FIGS. 14A to 14C. FIGS. 14A to 14C each illustrate an enlarged cross-sectional configuration of a portion corresponding to portion "EX8" of FIG. 8. In FIGS. 14A to 14C, the same reference numerals are used to denote the same elements as in FIGS. 1A, 1B, 8, and 11A to 11M, and detailed descriptions thereof are omitted.

Referring to FIG. 14A, the processes described with reference to FIGS. 13A to 13C may be performed. Thereafter, in a manner similar to that described with reference to FIG. 13D, a preliminary passivation insulating film PL may be etched by using the mask pattern MP4 as an etch mask in the resultant structure of FIG. 13C, and thus, a conductive pad 130 may be exposed and a passivation insulating film 420 may be formed. In this case, by controlling an etch end time point of the preliminary passivation insulating film PL, the passivation insulating film 420 may be formed to include a first passivation portion 420P1 and a second passivation portion 420P2. The first passivation portion 420P1 may be apart from the conductive pad 130. The second passivation portion 420P2 may be bent from the first passivation portion 420P1 and extend along the pad sidewall 130W of the conductive pad 130 in a direction away from the redistribution structure 110. After the passivation insulating film 420 is formed, an insulating structure 114 may not be exposed between the passivation insulating film 420 and the conductive pad 130.

Referring to FIG. 14B, the mask pattern MP4 may be removed from the resultant structure of FIG. 14A. Thereafter, flux 80 may be applied onto the conductive pad 130 in a manner similar to that described with reference to FIG. 11L. In this case, because the insulating structure 114 is covered by the passivation insulating film 420 and the conductive pad 130, when the flux 80 is applied onto the conductive pad 130, the flux 80 may be prevented from penetrating the insulating structure 114. In particular, the passivation insulating film 420 may include the first passivation portion 420P1 and the second passivation portion 420P2, which is bent from the first passivation portion 420P1 and covers the pad sidewall 130W of the conductive pad 130. Accordingly, even when the flux 80 is likely to penetrate an interface between the passivation insulating film 420 and the conductive pad 130, a penetration path for the flux 80 to reach the insulating structure 114 may be lengthened. Therefore, when the flux 80 is applied onto the conductive pad 130, the flux 80 may be relatively effectively prevented from penetrating the insulating structure 114.

Referring to FIG. 14C, in a manner similar to that described with reference to FIG. 11M, the external connection terminal 150 may be formed on the conductive pad 130 in the resultant structure of FIG. 14B, and thus, the semiconductor package 800 shown in FIG. 8 may be manufactured.

FIGS. 15A to 15D are cross-sectional views illustrating, according to a process sequence, a method of manufacturing an example of a semiconductor package 900. An example method of manufacturing the semiconductor package 900 shown in FIG. 9 will be described with reference to FIGS. 15A to 15D. FIGS. 15A to 15D each illustrate an enlarged cross-sectional configuration of a portion corresponding to portion "EX9" of FIG. 9. In FIGS. 15A to 15D, the same reference numerals are used to denote the same elements as in FIGS. 1A, 1B, 9, and 11A to 11M, and detailed descriptions thereof are omitted.

Figure 15A:
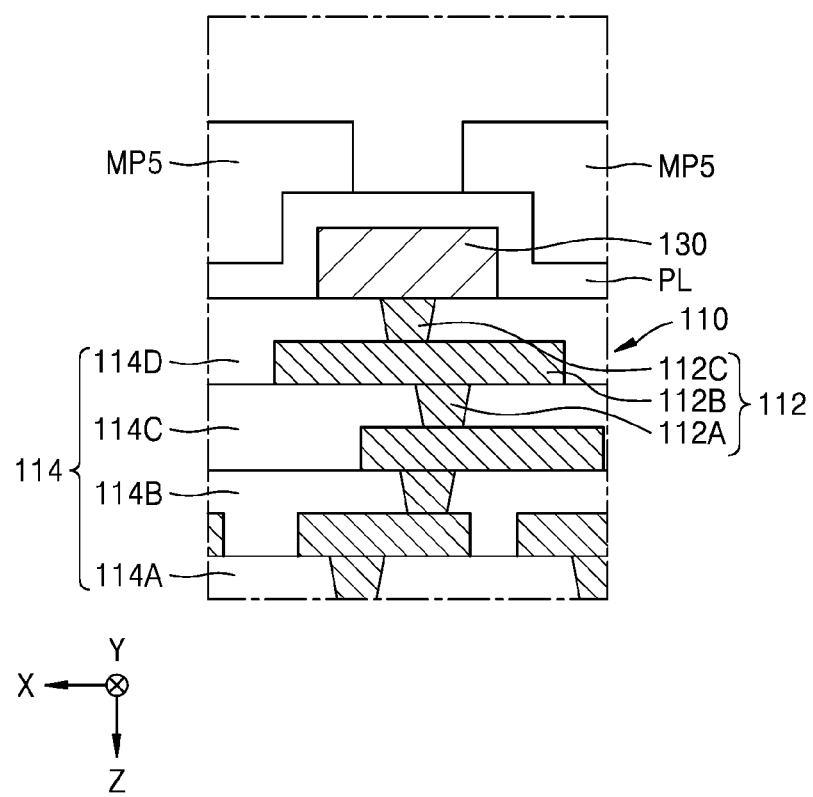

Referring to FIG. 15A, the processes described with reference to FIGS. 13A and 13B may be performed. Thereafter, a mask pattern MP5 may be formed on a preliminary passivation insulating film PL in a manner similar to that described with reference to FIG. 13C. Details of the mask pattern MP5 may be substantially the same as those of the mask pattern MP3, which have been described with reference to FIG. 11I. However, the mask pattern MP5 may be formed to completely cover a relatively low step portion of the preliminary passivation insulating film PL, which is adjacent to a conductive pad 130, and partially cover a relatively high step portion of the preliminary passivation insulating film PL, which is on the conductive pad 130.

Figure 15B:
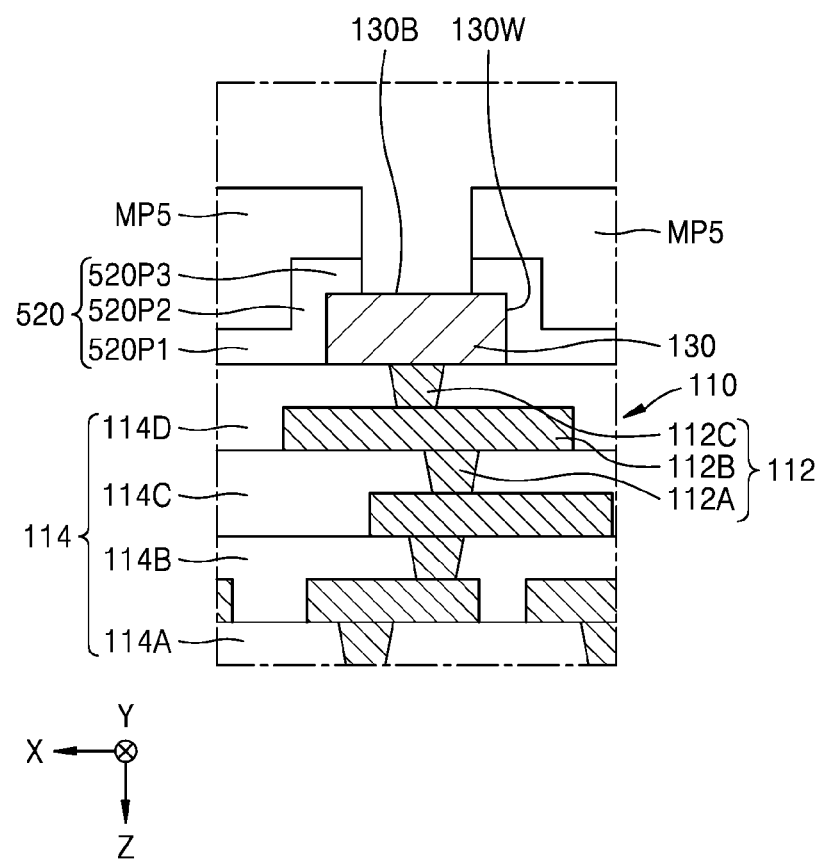

Referring to FIG. 15B, in a manner similar to that described with reference to FIG. 13D, the preliminary passivation insulating film PL may be etched by using the mask pattern MP5 as an etch mask in the resultant structure of FIG. 15A. Thus, an outer surface 130B of the conductive pad 130 may be exposed, and a passivation insulating film 520 may be formed. The passivation insulating film 520 may include a first passivation portion 520P1, a second passivation portion 520P2, and a third passivation portion 520P3. The first passivation portion 520P1 may be apart from the conductive pad 130. The second passivation portion 520P2 may be bent from the first passivation portion 520P1 and extend in a direction away from a second surface 110B of the redistribution structure 110 along the pad sidewall 130W of the conductive pad 130. The third passivation portion 520P3 may be bent from the second passivation portion 520P2 and extend along the outer surface 130B of the conductive pad 130 between the conductive pad 130 and the external connection terminal 150. After the passivation insulating film 520 is formed, the insulating structure 114 may not be exposed between the passivation insulating film 520 and the conductive pad 130.

Figure 15C:
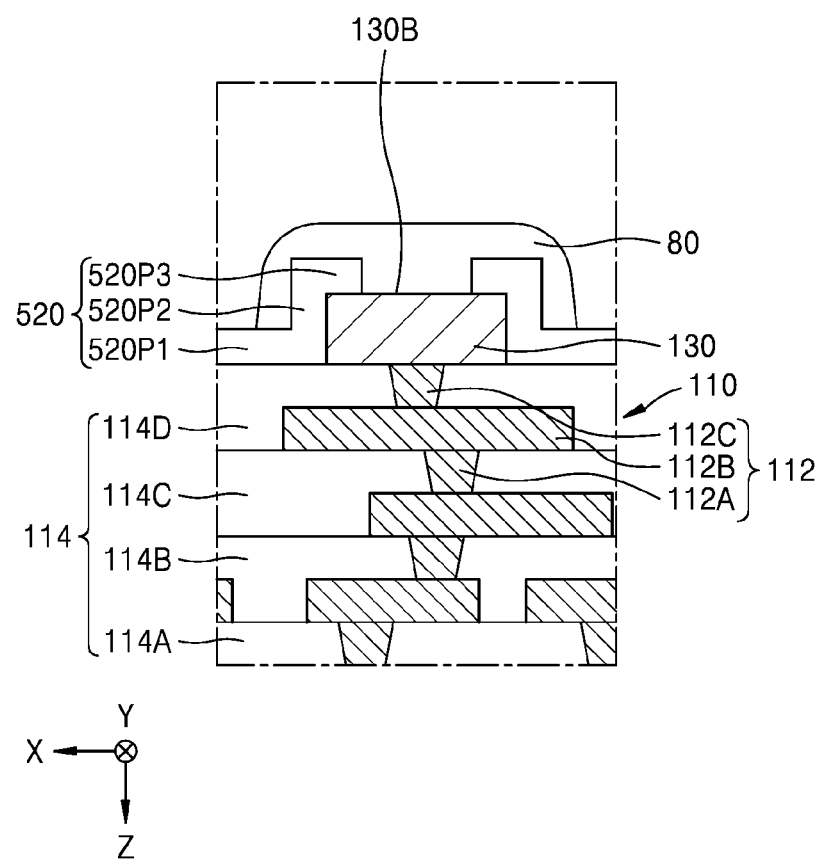

Referring to FIG. 15C, the mask pattern MP5 may be removed from the resultant structure of FIG. 14A. Thereafter, flux 80 may be applied onto the conductive pad 130 in a manner similar to that described with reference to FIG. 11L. In this case, because the insulating structure 114 is covered by the passivation insulating film 520 and the conductive pad 130, when the flux 80 is applied onto the conductive pad 130, the flux 80 may be prevented from penetrating the insulating structure 114. In particular, the passivation insulating film 520 may include the first passivation portion 520P1, the second passivation portion 520P2, which is bent from the first passivation portion 520P1 and covers the pad sidewall 130W of the conductive pad 130, and the third passivation portion 520P3 that extends along the outer surface 130B of the conductive pad 130. Accordingly, even when the flux 80 is likely to penetrate an interface between the passivation insulating film 520 and the conductive pad 130, a penetration path facilitating the flux 80 to reach the insulating structure 114 may be lengthened. Accordingly, when the flux 80 is applied onto the conductive pad 130, the flux 80 may be relatively effectively prevented from penetrating the insulating structure 114.

Figure 15D:
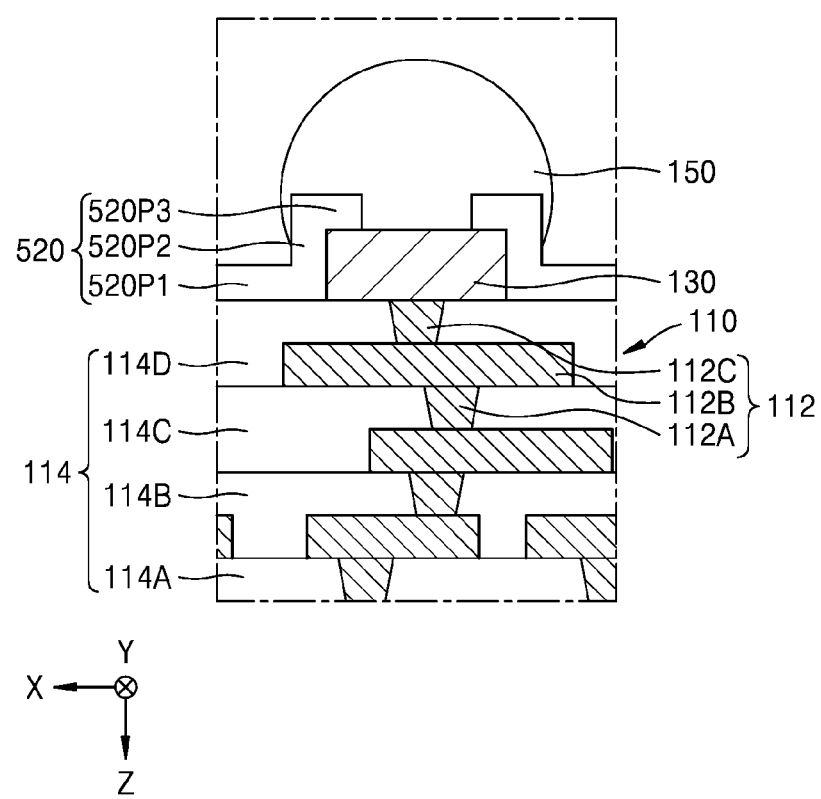

Referring to FIG. 15D, in a manner similar to that described with reference to FIG. 11M, the external connection terminal 150 may be formed on the conductive pad 140 in the resultant structure of FIG. 15C, and thus, the semiconductor package 900 shown in FIG. 9 may be manufactured.

While certain implementations have been particularly shown and described with, it will be understood that various changes in form and details may be made therein without departing from the spirit and scope of the following claims.

What is claimed is:

1. A semiconductor package comprising:
   a redistribution structure comprising a wiring structure and an insulating structure covering the wiring structure, the redistribution structure having a first surface and a second surface, which are opposite to each other, the insulating structure comprising a polymer;
   a semiconductor chip on the first surface of the redistribution structure, the semiconductor chip being connected to at least one first wiring pattern included in the wiring structure;
   a passivation insulating film covering the second surface of the redistribution structure, the passivation insulating film comprising an inner surface in contact with the insulating structure and comprising a hole sidewall defining a hole located at a position corresponding a second wiring pattern included in the wiring structure, the second wiring pattern being adjacent to the second surface of the redistribution structure, wherein the passivation insulating film comprises an inorganic, insulating material;
   a conductive pad extending through the hole of the passivation insulating film and contacting the second wiring pattern, the conductive pad having a pad sidewall comprising a portion in contact with the hole sidewall of the passivation insulating film; and
   an external connection terminal on the conductive pad, wherein the external connection terminal directly, physically contacts the pad sidewall of the conductive pad.

2. The semiconductor package of claim 1, wherein, in a direction perpendicular to the first surface of the redistribution structure, a thickness of the passivation insulating film is less than a thickness of the conductive pad.

3. The semiconductor package of claim 1, wherein the passivation insulating film has an outer surface that is opposite to the inner surface of the passivation insulating film, and the conductive pad protrudes more than the outer surface of the passivation insulating film in a direction away from the second surface of the redistribution structure.

4. The semiconductor package of claim 1, wherein the conductive pad protrudes more than the inner surface of the passivation insulating film in a direction away from the passivation insulating film.

5. The semiconductor package of claim 1, wherein the hole sidewall of the passivation insulating film is parallel to the direction perpendicular to the first surface of the redistribution structure.

6. The semiconductor package of claim 1, wherein the insulating structure comprises a photoimagable dielectric (PID), and the passivation insulating film comprises a silicon oxide film, a silicon nitride film, or a combination thereof.

7. The semiconductor package of claim 1, wherein the hole sidewall of the passivation insulating film protrudes more than a first passivation portion of the passivation insulating film, which is apart from the conductive pad, in a direction away from the second surface of the redistribution structure.

8. A semiconductor package comprising:
a redistribution structure comprising a wiring structure and an insulating structure covering the wiring structure, the redistribution structure having a first surface and a second surface, which are opposite to each other, the insulating structure comprising a polymer;
a semiconductor chip on the first surface of the redistribution structure, the semiconductor chip being connected to a plurality of first wiring patterns included in the wiring structure;
a passivation insulating film covering the second surface of the redistribution structure, the passivation insulating film comprising an inner surface in contact with the insulating structure and comprising a plurality of hole sidewalls defining a plurality of holes, respectively, located at positions corresponding to a plurality of second wiring patterns included in the wiring structure, which are adjacent to the second surface of the redistribution structure;
a plurality of conductive pads extending through the plurality of holes of the passivation insulating film, respectively; and
a plurality of external connection terminals on the plurality of conductive pads, respectively,
wherein each conductive pad of the plurality of conductive pads is in contact with a corresponding second wiring pattern of the plurality of second wiring patterns,
wherein each hole sidewall of the plurality of hole sidewalls of the passivation insulating film is in contact with a pad sidewall of a corresponding conductive pad of the plurality of conductive pads such that there are no spaces between the passivation insulating film and the plurality of conductive pads, and
wherein at least one external connection terminal of the plurality of external connection terminals directly, physically contacts the pad sidewall of a conductive pad of the plurality of conductive pads.

9. The semiconductor package of claim 8, wherein, in a direction perpendicular to the first surface of the redistribution structure, portions of the passivation insulating film, which are apart from the plurality of conductive pads, have a thickness less than each of the plurality of conductive pads.

10. The semiconductor package of claim 8, wherein the passivation insulating film has an outer surface that is opposite to the inner surface, and each of the plurality of conductive pads protrudes more than the outer surface of the passivation insulating film in a direction away from the second surface of the redistribution structure.

11. The semiconductor package of claim 8, wherein each of the plurality of conductive pads protrudes more than the inner surface of the passivation insulating film in a direction toward the first surface of the redistribution structure.

12. The semiconductor package of claim 8, wherein the passivation insulating film does not overlap the plurality of conductive pads in a direction perpendicular to the first surface of the redistribution structure.

13. The semiconductor package of claim 8, wherein the insulating structure comprises a photoimagable dielectric (PID), and the passivation insulating film comprises a silicon oxide film, a silicon nitride film, or a combination thereof.

14. The semiconductor package of claim 8, further comprising a conductive post around the semiconductor chip on the first surface of the redistribution structure, the conductive post being connected to a plurality of third wiring patterns in the wiring structure, wherein the plurality of conductive pads comprise a first conductive pad and a second conductive pad, the first conductive pad being connected to the semiconductor chip through the wiring structure, the second conductive pad being connected to the conductive post through the wiring structure.

15. A semiconductor package comprising:
a redistribution structure comprising an insulating structure and a wiring structure, the redistribution structure having a first surface and a second surface, which are opposite to each other, the insulating structure comprising a photoimagable dielectric (PID) comprising a polymer, the wiring structure comprising a plurality of wiring patterns located in the insulating structure;
a package unit on the first surface of the redistribution structure, the package unit comprising a semiconductor chip and a plurality of conductive posts adjacent to the semiconductor chip, the semiconductor chip being connected to a plurality of first wiring patterns selected from the plurality of wiring patterns, the plurality of conductive posts being connected to a plurality of second wiring patterns selected from the plurality of wiring patterns;
a passivation insulating film in contact with the second surface of the redistribution structure, wherein the passivation insulating film comprises an inorganic insulating material having a dielectric constant of about 7.5 or lower;
a plurality of conductive pads extending through a plurality of holes of the passivation insulating film, respectively, to contact a plurality of third wiring patterns selected from the plurality of wiring patterns; and
a plurality of solder balls on the plurality of conductive pads,
wherein the passivation insulating film comprises a plurality of holes and a plurality of respective hole sidewalls, the plurality of holes being configured to allow the plurality of conductive pads to pass therethrough, the plurality of respective hole sidewalls contacting respective pad sidewalls of the plurality of conductive pads such that there are no spaces between the plurality of conductive pads and the passivation insulating film, wherein at least one solder ball of the plurality of solder balls directly, physically contacts the pad sidewalls of a conductive pad of the plurality of conductive pads, and wherein the plurality of conductive pads comprise a plurality of first conductive pads and a plurality of second conductive pads, wherein the plurality of first conductive pads are connected to the semiconductor chip through the wiring structure, and the plurality of second conductive pads are connected to the plurality of conductive posts through the wiring structure.

16. The semiconductor package of claim 15, wherein, in a direction perpendicular to the first surface of the redistribution structure, the passivation insulating film has a first thickness that is selected in a range of about 50 nm to about 500 nm, and, in the direction perpendicular to the first surface of the redistribution structure, each of the plurality of conductive pads has a second thickness in a range of about 0.15 µm to about 3.0 µm.

17. The semiconductor package of claim 15, wherein the passivation insulating film has an inner surface in contact with the insulating structure and an outer surface that is opposite to the inner surface, and each of the plurality of conductive pads protrudes more than at least one of the inner surface and the outer surface of the passivation insulating film in a direction away from the passivation insulating film.

18. The semiconductor package of claim 15, wherein the insulating structure has a first surface in contact with the passivation insulating film and a plurality of second surfaces in contact with the plurality of conductive pads, and each of the plurality of second surfaces of the insulating structure is closer to the first surface of the redistribution structure than the first surface of the insulating structure.

* * * * *